(12) United States Patent
Kobayashi

(10) Patent No.: US 9,075,097 B2
(45) Date of Patent: Jul. 7, 2015

(54) TRANSMISSION DEVICE AND METHOD OF TESTING TRANSMISSION CHARACTERISTIC OF DUT

(75) Inventor: Shigeki Kobayashi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 193 days.

(21) Appl. No.: 13/408,232

(22) Filed: Feb. 29, 2012

(65) Prior Publication Data
US 2012/0223732 A1 Sep. 6, 2012

(30) Foreign Application Priority Data
Mar. 4, 2011 (JP) ................. 2011-047843

(51) Int. Cl.
G01R 31/00 (2006.01)
G01R 35/00 (2006.01)
G01R 31/28 (2006.01)
G01R 1/04 (2006.01)

(52) U.S. Cl.
CPC .......... G01R 35/005 (2013.01); *G01R 31/2889* (2013.01); *G01R 31/2822* (2013.01); *G01R 1/045* (2013.01)

(58) Field of Classification Search
CPC ............. G01R 35/005; G01R 31/2822; G01R 31/2889; G01R 1/045
USPC .......... 324/756.03, 756.01, 537, 500, 750.22, 324/754.11, 755.11
See application file for complete search history.

(56) References Cited

U.S. PATENT DOCUMENTS

| 5,841,810 A | * | 11/1998 | Wong et al. | ................ 375/232 |
|---|---|---|---|---|
| 6,036,502 A | * | 3/2000 | Neidich et al. | ................ 439/67 |
| 7,580,634 B2 | * | 8/2009 | Takeuchi et al. | ............... 398/38 |
| 7,852,101 B2 | * | 12/2010 | Tanioka et al. | .......... 324/755.07 |
| 2006/0213683 A1 | * | 9/2006 | Myoung et al. | ................ 174/255 |
| 2006/0251364 A1 | * | 11/2006 | Terahara et al. | .............. 385/100 |
| 2006/0279304 A1 | * | 12/2006 | Kuitani et al. | ................ 324/761 |
| 2007/0132466 A1 | * | 6/2007 | Kister | ........................... 324/754 |
| 2007/0296422 A1 | * | 12/2007 | Miller | ........................... 324/754 |
| 2008/0180120 A1 | * | 7/2008 | Kim et al. | ..................... 324/754 |

(Continued)

OTHER PUBLICATIONS

Controlled Jitter Generation for Jitter Tolerance and Jitter Transfer Testing, Application Note, 2005, Tektronix, Enabling Innovation (Discussed on p. 3 of specification).

*Primary Examiner* — Huy Q Phan
*Assistant Examiner* — David Frederiksen
(74) *Attorney, Agent, or Firm* — Rankin, Hill & Clark LLP

(57) ABSTRACT

There is provided a transmission device. The transmission device includes: an adapter device (11) including: a first surface having a plurality of first terminals (21) thereon; and a second surface opposite to the first surface and having a plurality of second terminals (22) thereon, wherein a pitch between the adjacent second terminals is different from a pitch between the adjacent first terminals, a plurality of signal lines each electrically connecting a corresponding one of the first terminals and a corresponding one of the second terminals; and a signal compensation device (12) connected to the adapter device through the signal lines and configured to compensate for a transmission loss of a signal path between the corresponding first terminal and the corresponding second terminal such that the transmission loss is set to a given value.

8 Claims, 22 Drawing Sheets

(56) References Cited

U.S. PATENT DOCUMENTS

| | | | |
|---|---|---|---|
| 2009/0194509 A1* | 8/2009 | Nada et al. | 216/83 |
| 2009/0219042 A1* | 9/2009 | Sasaki et al. | 324/754 |
| 2010/0026333 A1* | 2/2010 | Shouji | 324/761 |
| 2010/0117673 A1* | 5/2010 | Lee et al. | 324/761 |
| 2010/0142606 A1* | 6/2010 | Kato | 375/232 |
| 2011/0014949 A1* | 1/2011 | Arimura | 455/558 |
| 2011/0125308 A1* | 5/2011 | Watanabe et al. | 700/121 |
| 2011/0128027 A1* | 6/2011 | Watanabe et al. | 324/756.01 |

\* cited by examiner

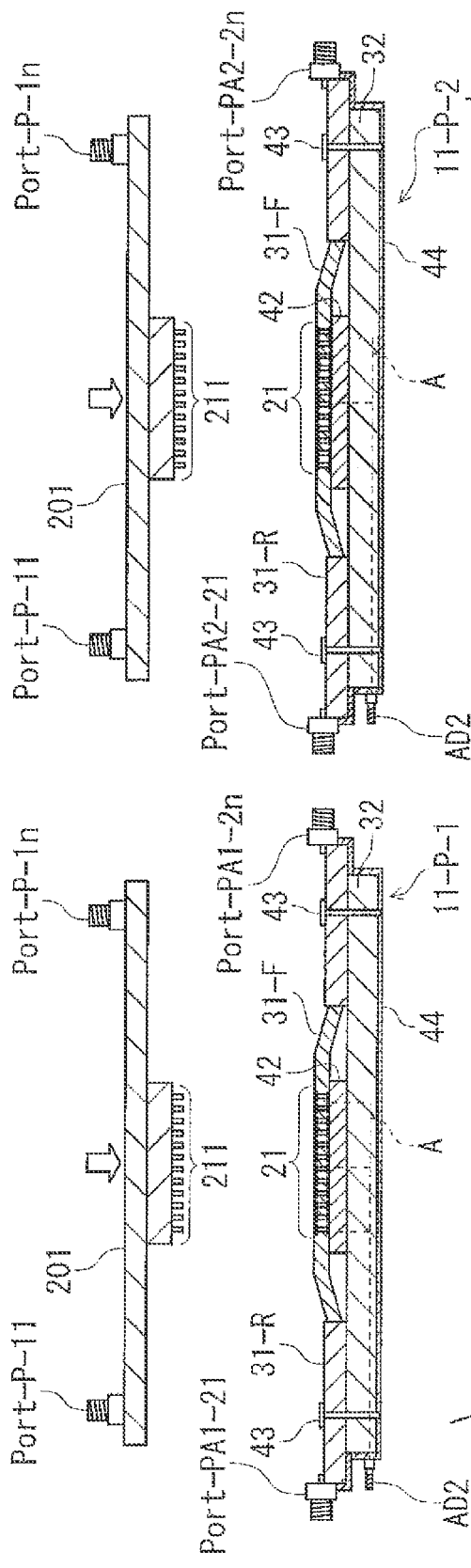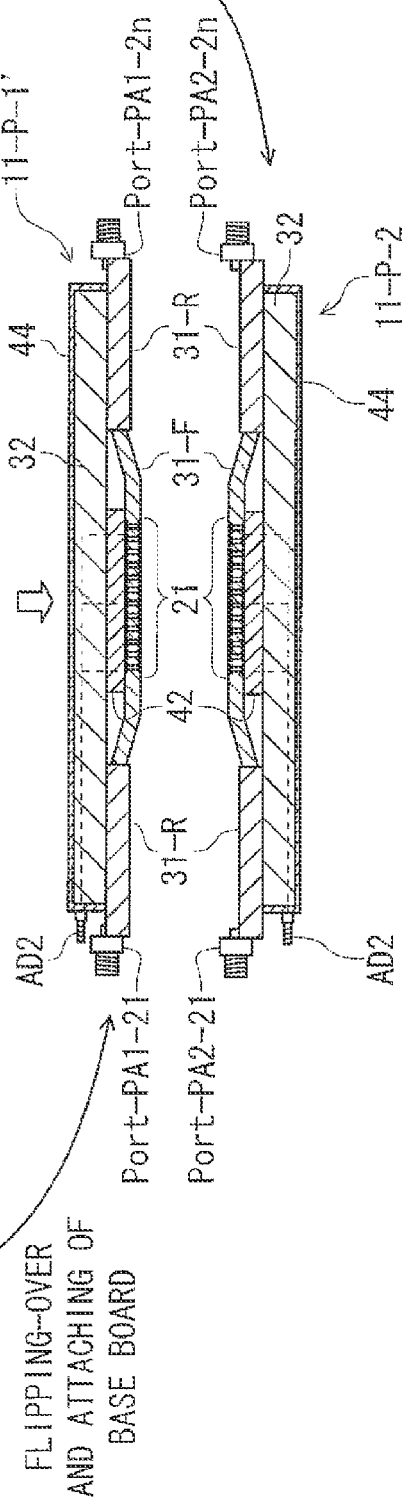

TRANSMISSION DEVICE AND METHOD OF TESTING TRANSMISSION CHARACTERISTIC OF DUT

This application claims priority from Japanese Patent Application No. 2011-047843, filed on Mar. 4, 2011, the entire contents of which are herein incorporated by reference.

BACKGROUND

1. Technical Field

Embodiments described herein relate to a transmission device and a method of testing a transmission characteristic of a DUT (device under test).

2. Description of Related Art

To evaluate the transmission quality of a data transmission device and a transmission line in terms of a jitter amount, a test signal generator having a jitter generating function and a jitter measuring instrument are used (refer to Non-patent document 1, for example).

FIG. 19 is a block diagram of an example common test signal generator having a jitter generating function. In the following, the same reference symbol that is given to constituent elements shown in different drawings means that they have the same function. In the test signal generator 101, jitter components produced in a noise source 111 by adding together two kinds of periodic jitter PJ1 and PJ2 each originating from sinusoidal noise and random noise originating from Gaussian noise are added to a clock signal or a data signal generated by a clock signal/data signal generation unit 112 and a resulting signal is caused to pass through a DDJ filter 113 for limiting the frequency bandwidth of a transmission system. Thus, a signal having data-dependent jitter (DDJ) is generated.

FIG. 20 is a block diagram showing an example jitter measuring system which uses a test signal generator having a jitter generating function. To measure transmission quality of an evaluation subject transmission line DUT by the jitter measuring system 1000 which uses the test signal generator 101 described above with reference to FIG. 19, it is necessary to jitter-calibrate, in advance, the test signal generator 101 which generates a jitter signal. In jitter calibration, the test signal generator 101 is connected to a jitter measuring instrument 102 by switching of a switch SW. The jitter measuring instrument 102 which is used for jitter calibration is equivalent to a performance monitor 103 for evaluating the transmission quality of the evaluation subject transmission line DUT actually. Individual jitter components of jitter generated by the test signal generator 101 are measured by the jitter measuring instrument 102, and the amount of jitter generated by the test signal generator 101 is adjusted so that the values of the measured jitter components become equal to reference values. To evaluate the transmission quality of the evaluation subject transmission line DUT using the jitter-calibrated test signal generator 101, the test signal generator 101 is connected to the evaluation subject transmission line DUT by switching of the switch SW. A jitter signal generated by the test signal generator 101 is input to the evaluation subject transmission line DUT, and a signal that is output from the evaluation subject transmission line DUT is observed by the performance monitor 103.

FIG. 21 is a sectional view illustrating a probe configuration for observation of an evaluation subject transmission line. The test signal generator 101 and the performance monitor 103 are connected to probe terminals 251 of a probe card 201 and socket terminals 252 of a socket board 202, respectively. The evaluation subject transmission line DUT which is an IC package, an interposer, or the like is placed on the socket board 202 in such a manner that its socket-side terminals 302 come into contact with the respective socket terminals 252, and the probe card 201 pressed against the evaluation subject transmission line DUT in such a manner that probe-side terminals of the evaluation subject transmission line DUT come into contact with the respective probe terminals 251.

[Non-patent document 1] "Controlled Jitter Generation for Jitter Tolerance and Transfer Testing," Tektronix, Inc., Application Note, 2005 (e.g., see following URL: http://www.tek.com/application-note/controlledjitter-generation-jitter-tolerance-and-jitter-transfer-testing).

The jitter amount of a signal that is output from the evaluation subject transmission line DUT and observed by the performance monitor 103 is influenced by a transmission loss of a signal path called a "test path" from the test signal generator 101 to the evaluation subject transmission line DUT. Therefore, the above-described jitter calibration of the test signal generator 101 needs to be carried out taking the presence of the test path into consideration. To detect a transmission loss of only the test path for the purpose of jitter calibration, it is necessary to realize a "bypass state" that the probe terminals 251 of the probe card 201 are connected to the respective socket terminals 252 of the socket board 202 without intervention of the evaluation subject transmission line DUT.

FIG. 22 is a sectional view illustrating a bypass state that the probe terminals 251 of the probe card 201 are connected to the respective socket terminals 252 of the socket board 202 without intervention of the evaluation subject transmission line DUT. The bypass state could be realized easily if the probe terminals 251 could be connected directly to the socket terminals 252 by pressing the former against the latter. However, where the evaluation subject transmission line DUT is an IC package, an interposer, or the like in which the probe-side terminals are different from the socket-side terminals in pitch and size (see FIG. 21), the probe terminals 251 of the probe card 201 are also made different from the socket terminals 252 of the socket board 202 in pitch and size. Therefore, the probe terminals 251 cannot be connected directly to the socket terminals 252 by simple pressing. In this case, it is necessary to connect (short-circuit) the probe terminals 251 to the socket terminals 252 by transmission lines (hereinafter referred to as "short-circuit transmission lines") 303, respectively, (see FIG. 22).

However, the short-circuit transmission lines 303 for the connection may have a larger transmission loss than the evaluation subject transmission line DUT. If a transmission characteristic of the short-circuit transmission lines 303 could be measured correctly, they might be used as reference values for jitter calibration. However, measuring a transmission characteristic of the short-circuit transmission lines 303 is more difficult in itself than measuring a transmission characteristic of the evaluation subject transmission line DUT. Furthermore, even if a transmission characteristic of the short-circuit transmission lines 303 could be defined as a jitter calibration reference, it is very difficult to manufacture plural sets of short-circuit transmission lines 303 whose transmission characteristic (absolute values) satisfies that definition, due to the variations in the manufacturing.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a transmission device. The transmission device includes: an adapter device including: a first surface having a plurality of first terminals thereon; and a second surface opposite to the first surface and having a plurality of second terminals thereon, wherein a pitch between the adjacent second terminals is different from a pitch between the adjacent first terminals; a plurality of signal lines each electrically connecting a corresponding first terminal and a corresponding second terminal; and a signal compensation device connected to the adapter device through the signal lines and configured to compensate for a transmission loss of a signal path between the corresponding first terminal and the corresponding second terminal such that the transmission loss is set to a given value.

Other aspects and advantages of the present invention will be apparent from the following description, the drawings and the claims.

BRIEF DESCRIPTION OF THE DRAWINGS

FIGS. 5A-5C are sectional views for description of the measuring method of S parameters of the adapter board of the transmission device according to the embodiment of the invention;

DETAILED DESCRIPTION OF EXEMPLARY EMBODIMENTS

Figure 1:
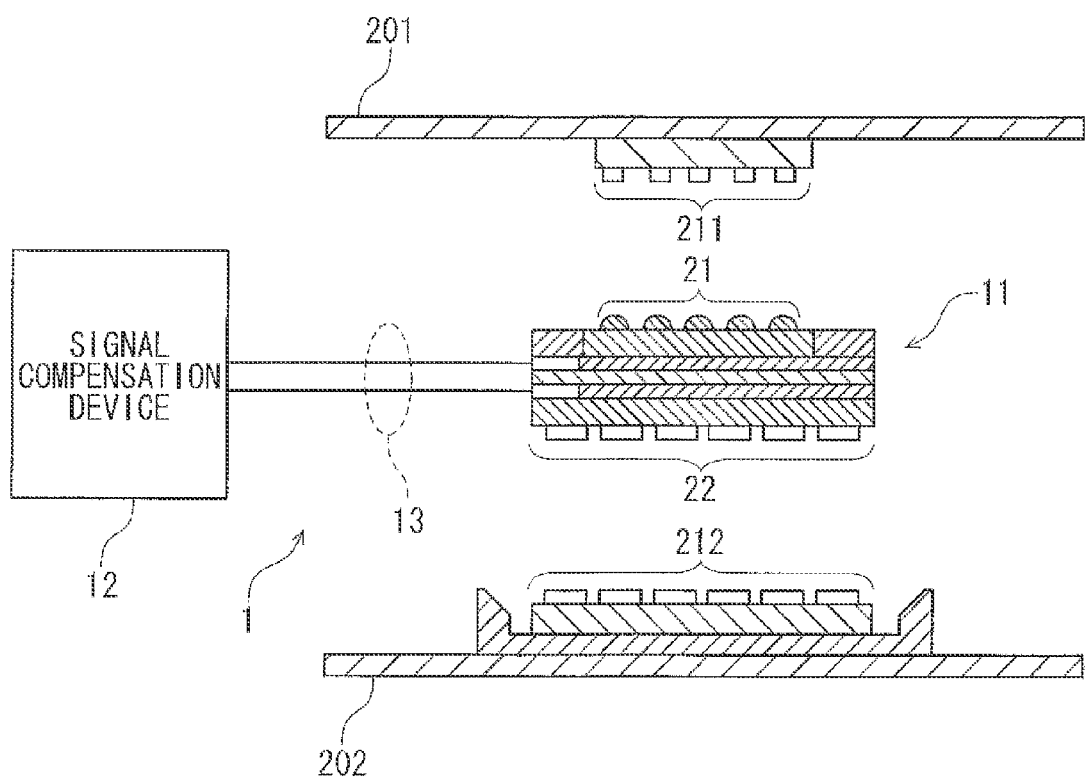
FIG. 1 shows a transmission device according to an embodiment of the present invention.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

FIG. 1 shows a transmission device according to an embodiment of the present invention. The transmission device 1 according to the embodiment of the invention is connected between a probe terminal group 211 of a probe card 201 and a socket terminal group 212 of a socket board 202 of an evaluation instrument for evaluating the transmission characteristic of an evaluation subject transmission line (not shown) in jitter-calibrating the evaluation instrument. The evaluation instrument is a generic term meaning the combination of the test signal generator 101 and the jitter measuring instrument 102 (equivalent to the performance monitor 103) that were described above with reference to FIGS. 19-22, and hence includes the probe terminal group 211 of the probe card 201 and the socket terminal group 212 of the socket board 202.

The transmission device 1 according to the embodiment of the invention is equipped with an adapter device 11 and a signal compensation device 12 which are connected to each other by a multiple coaxial cable 13. The multiple coaxial cable 13 serves to calibrate a signal path to each of the terminals of a first terminal group 21 and the terminals of a second terminal group 22 of the adapter device 11, for signals to be input to or output from these terminals.

The adapter device 11 has a first surface on which the first terminal group 21 is formed at the same pitch as the probe terminal group 211 and a second surface which is opposite to the first surface and on which the second terminal group 22 is formed at the same pitch as the socket terminal group 212. That is, the adapter device 11 has the same terminal structure as the evaluation subject transmission line (not shown) and is inserted between the probe terminal group 211 of the probe card 201 and the socket terminal group 212 of the socket board 202. When the adapter device 11 is sandwiched between the probe card 201 and the socket board 202 and brought into pressure contact with them, the terminals (top terminals) of the first terminal group 21 formed on the first surface and the terminals of the second terminal group 22 formed on the second surface of the adapter device 11 come into contact with the terminals of the probe terminal group 211 of the probe card 201 and the terminals of the socket terminal group 212 of the socket board 202, respectively.

The signal compensation device 12 is connected to the adapter device 11 by the multiple coaxial cable 13, and compensates a signal so that the transmission loss of each signal path from a terminal of the first terminal group 21 formed on the first surface of the adapter device 11 to the corresponding terminal of the second terminal group 22 formed on the second surface of the adapter device 11 becomes zero.

Assume that the adapter device 11 has been sandwiched between the probe card 201 and the socket board 202 and brought into pressure contact with them, the terminals of the first terminal group 21 formed on the first surface and the terminals of the second terminal group 22 formed on the second surface of the adapter device 11 have come into contact with the probe terminals 211 of the probe card 201 and the socket terminals 212 of the socket board 202, respectively, and jitter evaluation signals generated by the test signal generator (not shown) for calibration of the evaluation instrument have been input to the probe card 201. Signals that are output from the terminals of the probe terminal group 211 of the probe card 201 are input to the first terminal group 21 of the adapter device 11 and then input to the signal compensation device 12 via the multiple coaxial cable 13. The signal compensation device 12 corrects the received signals for transmission losses of the transmission lines from the first terminal group 21 of the adapter device 11 to (the internal circuits of) the signal compensation device 12. The correction is performed for each of the signals that have been input to the respective terminals of the first terminal group 21. Corrected signals are further corrected, in advance, for transmission losses of the transmission lines from (the internal circuits of) the signal compensation device 12 to the second terminal group 22 of the adapter device 11 (pre-emphasis), and resulting signals are transmitted to the second terminal group 22 of the adapter device 11 via the multiple coaxial cable 13. The pre-emphasis is also performed for each of the signals that have been input to the respective terminals of the first terminal group 21. Signals that are output from the second terminal group 22 of the adapter device 11 are input to the respective terminals of the socket terminal group 212 of the socket board 202. As a result of the above correction process of the signal compensation device 12, the transmission characteristic of the transmission lines from the first terminal group 21 of the adapter device 11 to the second terminal group 22 of the adapter device 11 is made equivalent to that of transmission lines that are free of transmission losses.

As described above, the transmission device 1 according to the embodiment of the invention functions like simulation transmission lines with no transmission losses when viewed from the first terminal group 21 and the second terminal group 22 which are the signal input terminals and output terminals of the transmission device 1. Therefore, with the transmission device 1 according to the embodiment of the invention, the above-mentioned "bypass state" that is necessary for jitter calibration of the evaluation instrument can be realized easily. In particular, even for an evaluation instrument for an evaluation subject transmission line such as an IC package or an interposer in which probe-side terminals are different from socket-side terminals in pitch and size, the above-mentioned "bypass state" can be realized easily merely by forming the terminals of the first terminal group 21 and the terminals of the second terminal group 22 so that they have the same pitches and sizes as the terminals of a probe terminal group and the terminals of a socket terminal group of such an evaluation instrument. Such correct jitter calibration makes it possible to perform, more correctly, jitter measurement of an evaluation subject transmission line such as an IC package or an interposer in which probe-side terminals are different from socket-side terminals in pitch and size.

Figure 2:
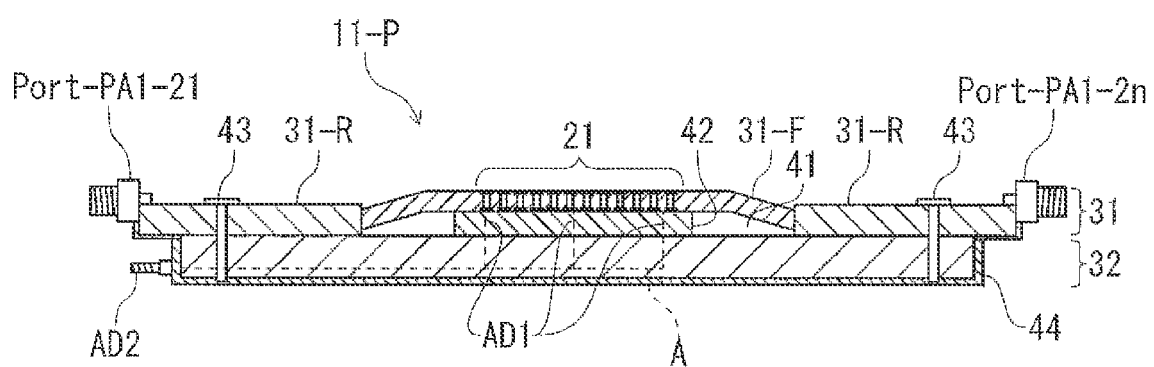
FIG. 2 is a sectional view illustrating the structure of an adapter board which is a part of an adapter device of the transmission device according to the embodiment of the invention.
Figure 3:
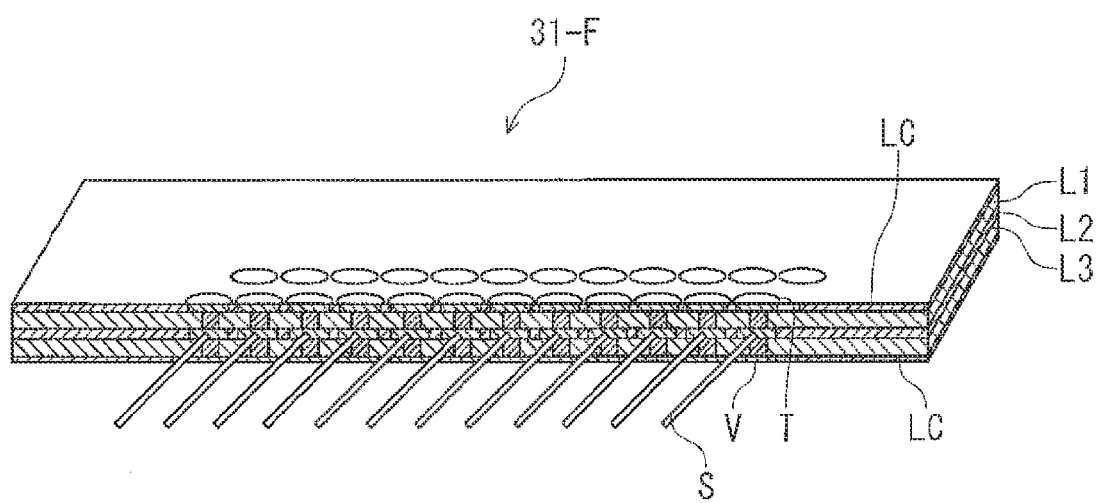
FIG. 3 is a cutaway view illustrating the structure of a flexible board portion of the adapter board shown in FIG. 2.

Next, the structure of the adapter device 11 will be described. FIG. 2 is a sectional view illustrating the structure of an adapter board which is a part of the adapter device 11 of the transmission device 1 according to the embodiment of the invention. FIG. 3 is a cutaway view illustrating the structure of a flexible board portion of the adapter board shown in FIG. 2. As described later, the adapter device 11 is provided with two adapter boards as shown in FIG. 2 and is obtained by connecting the two adapter boards in such a manner that they are oriented so that the terminal groups formed on them are directed to the probe card side and the socket board side, respectively. The adapter board on which the terminals are formed so as to be directed to the probe card side is denoted by reference symbol 11-P and the adapter board on which the terminals are formed so as to be directed to the socket board side is denoted by reference symbol 11-S. However, since the adapter boards 11-P and 11-S have the same type of structure, to simplify the description, only the adapter board 11-P on which the terminals are formed so as to be directed to the probe card side will be described with reference to FIGS. 2 and 3.

The adapter board 11-P has a rigid/flexible board 31 and a base board 32.

The rigid/flexible board 31 is provided with a flexible board portion 31-F and a rigid board portion 31-R. The flexible board portion 31-F is formed with terminal groups on its two respective surfaces and has a through via V and a strip line S leading from the through via V for each terminal pair T of the terminal groups. The rigid board portion 31-R is formed with an opening 41 which houses the flexible board portion 31-F. Strip lines S are formed inside the rigid board portion 31-R so as to be connected to output connectors Port-PA 1-21, . . . , Port-PA1-2n.

As shown in FIG. 3, the flexible board portion 31-F of the rigid/flexible board 31 has three copper foil layers L1, L2, and L3 and polyimide films (insulating materials) and the strip lines S lead from the portions, existing in the intermediate layer L2, of the through vias V. The top layer L1 and the bottom layer L3 of the flexible board portion 31-F are grounded to solid patterns LC.

The strip lines S leading from the flexible board portion 31-F are connected to the coaxial connectors Port-PA 1-21, . . . , Port-PA1-2n mounted on the rigid board portion 31-R via the strip lines S that are formed inside the rigid board portion 31-R. The strip lines S that are formed inside the rigid board portion 31-R are symmetrical with respect to a horizontal plane. The rigid board portion 31-R is a Teflon (registered trademark) board, a glass epoxy board, or the like. Where higher priority should be given to the relative permittivity of the rigid board portion 31-R, it is preferable that the rigid board portion 31-R be a Teflon (registered trademark) board.

On the other hand, the insulative base board 32 has, on its top surface, a projection 42 which is so thick that the terminal-group-formed surfaces of the flexible board portion 31-F are pushed up in the opening 41 so as to become higher than the corresponding surfaces of the rigid board portion 31-R when the base board 32 is attached to the rigid/flexible board 31. The base board 32 is a Teflon (registered trademark) board, a Bakelite board, or the like. Where higher priority should be given to the relative permittivity of the base board 32, it is preferable that the base board 32 be a Teflon (registered trademark) board. The bottom surface of the base board 32 is formed with a shield 44.

The base board 32 is formed inside with an air duct A (represented by a broken line in FIG. 2) which connects first duct opening ends AD1 formed in the top surface and a second duct opening end AD2 formed in a side surface of the base board 32. The rigid/flexible board 31 and the base board 32 are attached to each other in a detachable manner That is, to attach the rigid/flexible board 31 to the base board 32, the flexible board portion 31-F is absorbed on the base board 32 by sucking air through the air duct A in the direction from the first duct opening ends AD1 to the second duct opening end AD2 using an air pump (not shown) and then fixed to the base board 32 with screws 43. When the screws 43 are removed and air is discharged through the air duct A in the direction from the second duct opening end AD2 to the first duct opening ends AD1 using the air pump, the flexible board portion 31-F, that is, the rigid/flexible board 31, is detached from the base board 32. As described later, to perform a measurement on the adapter board 11-P (or 11-S), the screws 43 are removed, the base board 32 is detached from the rigid/flexible board 31, and the base board 32 is flipped over and attached to the other surface of the rigid/flexible board 31 so that the projection 42 of the base board 32 pushes up terminal-group-formed surfaces of the flexible board portion 31-F in the opposite direction to the preceding push-up direction. A partner adapter board is formed in this manner.

As mentioned above, the adapter device 11 is equipped with the two adapter boards 11-P and 11-S. The adapter device 11 is formed by connecting the base boards 32 of the adapter boards 11-P and 11-S so that the terminal groups formed on the surfaces of the adapter boards 11-P and 11-S are directed to the probe card side and the socket board side, respectively.

To use the above-described adapter device 11 in combination with the signal compensation device 12, it is necessary to measure S parameters ($S_{12}$ and $S_{21}$) of the adapter device 11 itself in advance.

A common method for measuring S parameters is to connect RF probe pins to the terminals (pads) of the flexible board portion 31-F of the adapter device 11 and measure S parameters of the transmission line between an RF probe and the connectors Port-PA1-21, . . . , Port-PA1-2n of the rigid board portion 31-R with a vector network analyzer (VNA). However, this measuring method has the following two problems. First, it is necessary to newly develop an RF probe for calibration of the vector network analyzer and a through calibration device to which connectors are to be connected and it takes long time for the development. Second, there may occur a case that the RF probe pins cannot be connected to all the terminals (pads) of the flexible board portion 31-F depending on the structure and the pin pitch of the RF probe. Furthermore, there may occur a case that the measurement upper limit frequency is restricted by the pitch of the RF probe pins and measurements up to a highest frequency that are necessary for evaluation cannot be performed.

Figure 4:
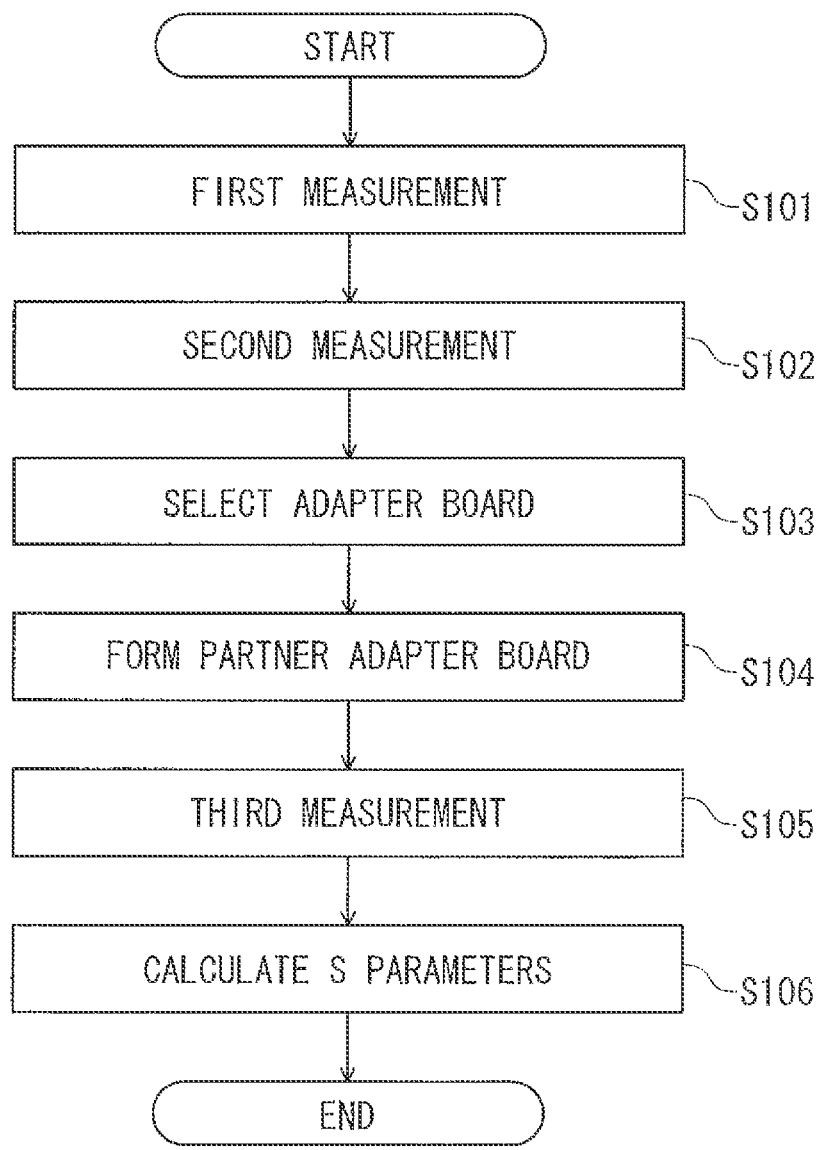
FIG. 4 is a flowchart of a measuring method of S parameters of an adapter board of the transmission device according to the embodiment of the invention.

The following method is employed as a measurement of S parameters of the adapter board of the transmission device 1 according to the embodiment of the invention. FIG. 4 is a flowchart of the measuring method of S parameters of the adapter board of the transmission device 1 according to the embodiment of the invention. FIGS. 5A-5C are sectional views for description of the measuring method of S parameters of the adapter board of the transmission device 1 according to the embodiment of the invention. Although the following description is directed to measurement of the adapter board 11-P to face the probe card side, the same measuring method can be applied to the adapter board 11-S to face the socket board side.

At a first measurement step S101 shown in FIG. 4 and FIG. 5A, a probe terminal group 211 (measuring-instrument side terminal group) of the evaluation instrument is pressed against the terminal group 21 of a first adapter board 11-P-1 (above-described adapter board). S parameters of the signal transmission line between connectors Port-P-11, . . . , Port-P-1n of the probe card 201 and the connectors Port-PA 1-21, . . . , Port-PA1-2n of the first adapter board 11-P-1 are measured by the evaluation instrument. The values of the measured S parameters are represented by S.

At a second measurement step S102, as shown in FIG. 4 and FIG. 5B, the probe terminal group 211 (measuring-instrument side terminal group) of the evaluation instrument is pressed against the terminal group 21 of an adapter board 11-P-2 (above-described adapter board) which is different from the first adapter board 11-P-1. Herein, it should be noted that the probe card 211 and the probe terminal group 211 used at the second measurement step S102 are the same used at the first measurement step S101, respectively. S parameters of the signal transmission line between the connectors Port-P-11, . . . , Port-P-1n of the probe card 201 and the connectors Port-PA2-21, . . . , Port-PA2-2n of the adapter board 11-P-2 are measured by the evaluation instrument. This step is executed plural times as described below.

At a selection step S103, a second adapter board 11-P-2 having the same S parameters $S_{paa}$ as the first adapter board 11-P-1 is selected from the adapter boards whose S parameters were measured at the second measurement step S102. The second measurement step S102 is executed plural times until an adapter board having the same S parameters $S_{paa}$ as the first adapter board 11-P-1 is found. As a result, the first adapter board 11-P-1 and the second adapter board 11-P-2 have the same S parameters $S_{paa}$.

At a partner adapter board forming step S104, a partner adapter board 11-P-1' is formed by removing the base board 32 of the first adapter board 11-P-1 from its rigid/flexible board 31 and flipping over the base board 32 and attaching it to the other surface of the rigid/flexible board 31 so that the projection 42 of the base board 32 pushes up the terminal-group-21-formed surface of the flexible board portion 31-F in the opposite direction to the preceding push-up direction. As described above with reference to FIG. 2, the base board 32 is removed and attached by sucking or discharging air through the air duct A.

At a third measurement step S105, the terminal group 21 of the second adapter board 11-P-2 and the terminal group 21 of the partner adapter board 11-P-1' are pressed against each other. S parameters of the signal transmission line between connectors of the second adapter board 11-P-2 and the connectors of the partner adapter board 11-P-1' are measured by the evaluation instrument. The values of the measured S parameters are represented by $S_{arb}$. At the third measurement step S105, it is preferable to confirm that in the measured S parameter $S_{arb}$ the magnitudes of $S_{11}$ and $S_{22}$ are sufficiently smaller than the magnitudes of $S_{12}$ and $S_{21}$. It is also preferable to confirm, by a TDR measurement, that there are no impedance variations at the connecting points of the terminal group 21 of the second adapter board 11-P-2 and the terminal group 21 of the partner adapter board 11-P-1'.

At a calculation step S106, S parameters of the second adapter board 11-P-2 are calculated by a computing device using the S parameters measured at the third measurement step S105. The calculation step S106 consists of a first conversion step of converting the S parameters measured at the third measurement step S105 into T parameters $T_{arb}$, a square root calculating step of calculating a matrix square root of the T parameters and a second conversion step of converting the calculated matrix square root of the T parameters into S parameters and employing them as S parameters of the second adapter board 11-P-2.

Figure 6:
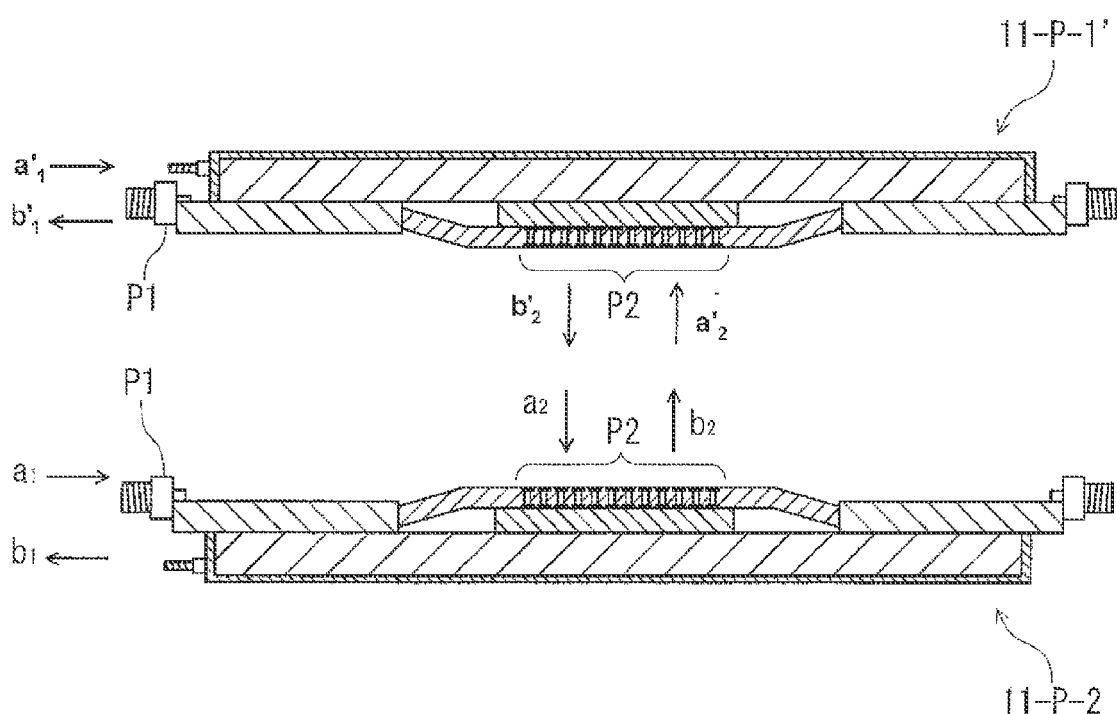
FIG. 6 is a sectional view for description of a process of calculating S parameters of the adapter board of the transmission device according to the embodiment of the invention.

The calculation step S106 will be described below in more detail. FIG. 6 is a sectional view for description of a process of calculating S parameters of the adapter board of the transmission device 1 according to the embodiment of the invention. In FIG. 6, connectors of the partner adapter board 11-P-1' and the second adapter board 11-P-2 are denoted by P1 and the terminals on the flexible board portion 31-F are denoted by P2. Consideration will be given to a case that as shown in FIG. 6 the second adapter board 11-P-2 and the partner adapter board 11-P-1' having the same S parameters as the second adapter board 11-P-2 are connected to each other. That is, in a state that the terminals P2 of the second adapter board 11-P-2 and the terminals P2 of the partner adapter board 11-P-1' are connected to (pressed against) each other, a signal is input through a connector P1 of the second adapter board 11-P-2 and a signal is output from a connector P1 of the partner adapter board 11-P-1' via a terminal P2 of the second adapter board 11-P-2 and a terminal P2 of the partner adapter board 11-P-1'. A signal component incident on the connector P1 of the second adapter board 11-P-2 is represented by $a_1$ and a signal component reflected at the connector P1 is represented by $b_1$. A signal component incident on the terminal P2 of the second adapter board 11-P-2 is represented by $a_2$ and a signal component reflected at the terminal P2 is represented by $b_2$. A signal component incident on the connector P1 of the partner adapter board 11-P-1' is represented by $a'_1$ and a signal component reflected at the connector P1 is represented by $b'_1$. A signal component incident on the terminal P2 of the partner adapter board 11-P-1' is represented by $a'_2$ and a signal component reflected at the terminal P2 is represented by $b'_2$.

The S parameter matrix $S_{ap}$ and the T parameter matrix $T_{ap}$ of the transmission line from the connector P1 of the second adapter board 11-P-2 to its terminal P2 are expressed as Equations (1) and (2), respectively.

$$S_{ap} = \begin{bmatrix} S_{11} & S_{12} \\ S_{21} & S_{22} \end{bmatrix} \quad (1)$$

$$T_{ap} = \begin{bmatrix} T_{11} & T_{12} \\ T_{21} & T_{22} \end{bmatrix} \quad (2)$$

On the other hand, the S parameter matrix $S_{ap}'$ and the T parameter matrix $T_{ap}'$ of the transmission line from the connector P1 of the partner adapter board 11-P-1' are given by Equations (3) and (4), respectively.

$$S_{ap}' = \begin{bmatrix} S_{11}' & S_{12}' \\ S_{21}' & S_{22}' \end{bmatrix} \quad (3)$$

$$T_{ap}' = \begin{bmatrix} T_{11}' & T_{12}' \\ T_{21}' & T_{22}' \end{bmatrix} \quad (4)$$

The S parameter matrices $S_{ap}$ and $S_{ap}'$ satisfy the relationship of Equation (5) as described above with reference to FIGS. 4 and 5A-5C.

$$S_{ap}' = S_{ap} \quad (5)$$

The T parameter matrices $T_{ap}$ and $T_{ap}'$ can be obtained by converting the S parameters and are given by Equations (6) and (7), respectively.

$$T_{ap} = \begin{bmatrix} T_{11} & T_{12} \\ T_{21} & T_{22} \end{bmatrix} = \begin{bmatrix} \dfrac{S_{12}S_{21} - S_{11}S_{22}}{S_{21}} & \dfrac{S_{11}}{S_{21}} \\ -\dfrac{S_{22}}{S_{21}} & \dfrac{1}{S_{21}} \end{bmatrix} \quad (6)$$

$$T_{ap}' = \begin{bmatrix} T_{11}' & T_{12}' \\ T_{21}' & T_{22}' \end{bmatrix} = \begin{bmatrix} \dfrac{S_{12}'S_{21}' - S_{11}'S_{22}'}{S_{21}'} & \dfrac{S_{11}'}{S_{21}'} \\ -\dfrac{S_{22}'}{S_{21}'} & \dfrac{1}{S_{21}'} \end{bmatrix} \quad (7)$$

Equation (7) gives the T parameter matrix corresponding to the signal transmission direction from the connector P1 of the partner adapter board 11-P-1' to its terminal P2. In the state that as shown in FIG. 6 the partner adapter board 11-P-1' is connected to the second adapter board 11-P-2, a signal is transmitted in the opposite direction, that is, from the terminal P2 to the connector P1. In this case, the T parameter matrix $T_{apa}'$ corresponding to the signal transmission direction from the terminal P2 of the partner adapter board 11-P-1' to its connector P1 is given by Equation (8).

$$T_{apa}' = \begin{bmatrix} T_{11}'^a & T_{12}'^a \\ T_{21}'^a & T_{22}'^a \end{bmatrix} = \begin{bmatrix} \dfrac{S_{21}'S_{12}' - S_{22}'S_{11}'}{S_{12}'} & \dfrac{S_{22}'}{S_{12}'} \\ -\dfrac{S_{11}'}{S_{12}'} & \dfrac{1}{S_{12}'} \end{bmatrix} \quad (8)$$

The S parameter matrix $S_{pt}$ and the T parameter matrix $T_{pt}$ of the transmission line from the connector P1 of the second adapter board 11-P-2 to the connector P1 of the partner adapter board 11-P-1' are expressed as Equations (9) and (10), respectively. The relationship between the signal occurring at the connector P1 of the second adapter board 11-P-2 and the signal occurring at the connector P1 of the partner adapter board 11-P-1' are given by Equation (11).

$$S_{pt} = \begin{bmatrix} S_{11}^t & S_{12}^t \\ S_{21}^t & S_{22}^t \end{bmatrix} \quad (9)$$

$$T_{pt} = \begin{bmatrix} T_{11}^t & T_{12}^t \\ T_{21}^t & T_{22}^t \end{bmatrix} \quad (10)$$

$$\begin{bmatrix} b_1 \\ a_1 \end{bmatrix} = \begin{bmatrix} T_{11}^t & T_{12}^t \\ T_{21}^t & T_{22}^t \end{bmatrix} \begin{bmatrix} a_1' \\ b_1' \end{bmatrix} \quad (11)$$

The relationship between the signals occurring at the connector P1 and the terminal P2 of the second adapter board 11-P-2 is given by Equation (12) from the definition of $T_{ap}$.

$$\begin{bmatrix} b_1 \\ a_1 \end{bmatrix} = \begin{bmatrix} T_{11} & T_{12} \\ T_{21} & T_{22} \end{bmatrix} \begin{bmatrix} a_2 \\ b_2 \end{bmatrix} \quad (12)$$

Likewise, the relationship between the signals occurring at the connector P1 and the terminal P2 of the partner adapter board 11-P-1' is given by Equation (13) from the definition of $T_{apa}'$.

$$\begin{bmatrix} b_2' \\ a_2' \end{bmatrix} = \begin{bmatrix} T_{11}'^a & T_{12}'^a \\ T_{21}'^a & T_{22}'^a \end{bmatrix} \begin{bmatrix} a_1' \\ b_1' \end{bmatrix} \quad (13)$$

Since the second adapter board 11-P-2 and the partner adapter board 11-P-1' are connected to each other in cascade, Equation (14) holds.

$$\begin{bmatrix} a_2 \\ b_2 \end{bmatrix} = \begin{bmatrix} b_2' \\ a_2' \end{bmatrix} \quad (14)$$

Therefore, Equation (12) can be modified into Equation (15) using Equations (14), (13), and (11).

$$\begin{bmatrix} b_1 \\ a_1 \end{bmatrix} = \begin{bmatrix} T_{11} & T_{12} \\ T_{21} & T_{22} \end{bmatrix} \begin{bmatrix} b_2 \\ a_2 \end{bmatrix} \quad (15)$$

$$= \begin{bmatrix} T_{11} & T_{12} \\ T_{21} & T_{22} \end{bmatrix} \begin{bmatrix} b_2' \\ a_2' \end{bmatrix}$$

$$= \begin{bmatrix} T_{11} & T_{12} \\ T_{21} & T_{22} \end{bmatrix} \begin{bmatrix} T_{11}'^a & T_{12}'^a \\ T_{21}'^a & T_{22}'^a \end{bmatrix} \begin{bmatrix} b_1' \\ a_1' \end{bmatrix}$$

$$= \begin{bmatrix} T_{11}^t & T_{12}^t \\ T_{21}^t & T_{22}^t \end{bmatrix} \begin{bmatrix} b_1' \\ a_1' \end{bmatrix}$$

Equation (15) includes the matrices of Equations (16) and (17) from Equations (6) and (8).

$$\begin{bmatrix} T_{11} & T_{12} \\ T_{21} & T_{22} \end{bmatrix} = \begin{bmatrix} \frac{S_{12}S_{21} - S_{11}S_{22}}{S_{21}} & \frac{S_{11}}{S_{21}} \\ -\frac{S_{22}}{S_{21}} & \frac{1}{S_{21}} \end{bmatrix} \quad (16)$$

$$\begin{bmatrix} T_{11}'^a & T_{12}'^a \\ T_{21}'^a & T_{22}'^a \end{bmatrix} = \begin{bmatrix} \frac{S_{21}'S_{12}' - S_{22}'S_{11}'}{S_{12}'} & \frac{S_{22}'}{S_{12}'} \\ -\frac{S_{11}'}{S_{12}'} & \frac{1}{S_{12}'} \end{bmatrix} \quad (17)$$

Since the S parameter matrices $S_{ap}$ and $S_{ap}'$ are the same, the relationships $S_{11}=S'_{11}$, $S_{12}=S'_{12}$, $S_{21}=S'_{21}$, and $S_{22}=S'_{22}$ hold. And the relationships $S_{12}=S_{21}$ and $S'_{12}=S'_{21}$ hold. Furthermore, if $S_{11}\ll 1$, $S_{22}\ll 1$, $S'_{22}\ll 1$, $S'_{11}\ll 1$, $S_{11}\ll S_{21}$, $S_{22}\ll S_{21}$, $S'_{22}\ll S'_{12}$, and $S'_{11}\ll S'_{12}$, equations (16) and (17) are approximated into Equations (18) and (19), respectively.

$$\begin{bmatrix} T_{11} & T_{12} \\ T_{21} & T_{22} \end{bmatrix} \cong \begin{bmatrix} \frac{S_{12}S_{21} - S_{11}S_{22}}{S_{21}} & 0 \\ 0 & \frac{1}{S_{21}} \end{bmatrix} \quad (18)$$

$$\begin{bmatrix} T_{11}'^a & T_{12}'^a \\ T_{21}'^a & T_{22}'^a \end{bmatrix} \cong \begin{bmatrix} \frac{S_{21}'S_{12}' - S_{22}'S_{11}'}{S_{12}'} & 0 \\ 0 & \frac{1}{S_{12}'} \end{bmatrix} \quad (19)$$

The above-mentioned relationships $S_{11}\ll 1$, $S_{22}\ll 1$, $S'_{22}\ll 1$, and $S'_{11}\ll 1$ can be confirmed in the following manner. First, in a state that the second adapter board 11-P-2 and the partner adapter board 11-P-1' are pressed against each other, one should make an attempt to confirm that the reflection component at the connector P1 of each of the second adapter board 11-P-2 and the partner adapter board 11-P-1' is sufficiently smaller than 1. As a result, the relationships $S_{11}\ll 1$ and $S_{11}'\ll 1$ can be confirmed. Then, one should confirm that the impedance variation at the connecting point of the terminal P2 of the second adapter board 11-P-2 and the terminal P2 of the partner adapter board 11-P-1' by performing a TDR measurement between the connector P1 of the second adapter board 11-P-2 and the connector P1 of the partner adapter board 11-P-1'. As a result, the relationships $S_{22}\ll 1$ and $S_{22}'\ll 1$ can be confirmed. In addition, the relationship $S_{11}\ll S_{21}$, $S_{22}\ll S_{21}$, $S'_{22}\ll S'_{12}$, and $S'_{11}\ll S'_{12}$ can be confirmed by performing a measurement of the transmission characteristics between the connector P1 of the second adapter board 11-P-2 and the connector P1 of the partner adapter board 11-P-1'.

From Equations (18) and (19), the following relationship is obtained.

$$\begin{bmatrix} T_{11} & T_{12} \\ T_{21} & T_{22} \end{bmatrix} \cong \begin{bmatrix} T_{11}'^a & T_{12}'^a \\ T_{21}'^a & T_{22}'^a \end{bmatrix}$$

Therefore, Equation (20) is as follows.

$$\begin{bmatrix} T_{11}^t & T_{12}^t \\ T_{21}^t & T_{22}^t \end{bmatrix} \cong \begin{bmatrix} T_{11} & T_{12} \\ T_{21} & T_{22} \end{bmatrix} \begin{bmatrix} T_{11} & T_{12} \\ T_{21} & T_{22} \end{bmatrix} \quad (20)$$

The matrix $$\begin{bmatrix} T_{11} & T_{12} \\ T_{21} & T_{22} \end{bmatrix}$$

is obtained as a matrix square root of the matrix $$\begin{bmatrix} T_{11}^t & T_{12}^t \\ T_{21}^t & T_{22}^t \end{bmatrix}$$

S parameters $S_{ap}$ (Equation (22)) of the second adapter board 11-P-2 itself are determined by converting the T parameters $T_{ap}$ (Equation (21); obtained from Equation (20)) of the second adapter board 11-P-2 itself $$T_{ap} = \begin{bmatrix} T_{11} & T_{12} \\ T_{21} & T_{22} \end{bmatrix} \quad (21)$$

$$S_{ap} = \begin{bmatrix} S_{11} & S_{12} \\ S_{21} & S_{22} \end{bmatrix} \quad (22)$$

Since Equation (23) holds, S parameters of the partner adapter board 11-P-1' can also be determined $$\begin{bmatrix} S'_{11} & S'_{12} \\ S'_{21} & S'_{22} \end{bmatrix} = \begin{bmatrix} S_{11} & S_{12} \\ S_{21} & S_{22} \end{bmatrix} \quad (23)$$

$S_{1t}$ and $S_{21}$ ($S_{12}=S_{21}$) of the S parameters $S_{ap}$ will be used as the pass characteristic of the adapter board in setting an equalizer circuit and a pre-emphasis circuit.

Next, the configuration of the signal compensation device 12 will be described. The signal compensation device 12 generally has, as signal paths, two circuits which are an equalizer circuit and a pre-emphasis circuit. The equalizer circuit compensates for transmission losses of the signal transmission lines from one terminal group for receiving signals of the adapter device 11 to the signal compensation device 12. The pre-emphasis circuit compensates, in advance, for transmission losses of the signal transmission lines from the signal compensation device 12 to the other terminal group for sending out signals of the adapter device 11. In terms of a specific circuit configuration, the signal compensation device 12 is composed of switch modules (SW Modules) and equalizer modules (EQ Modules).

Figure 7:
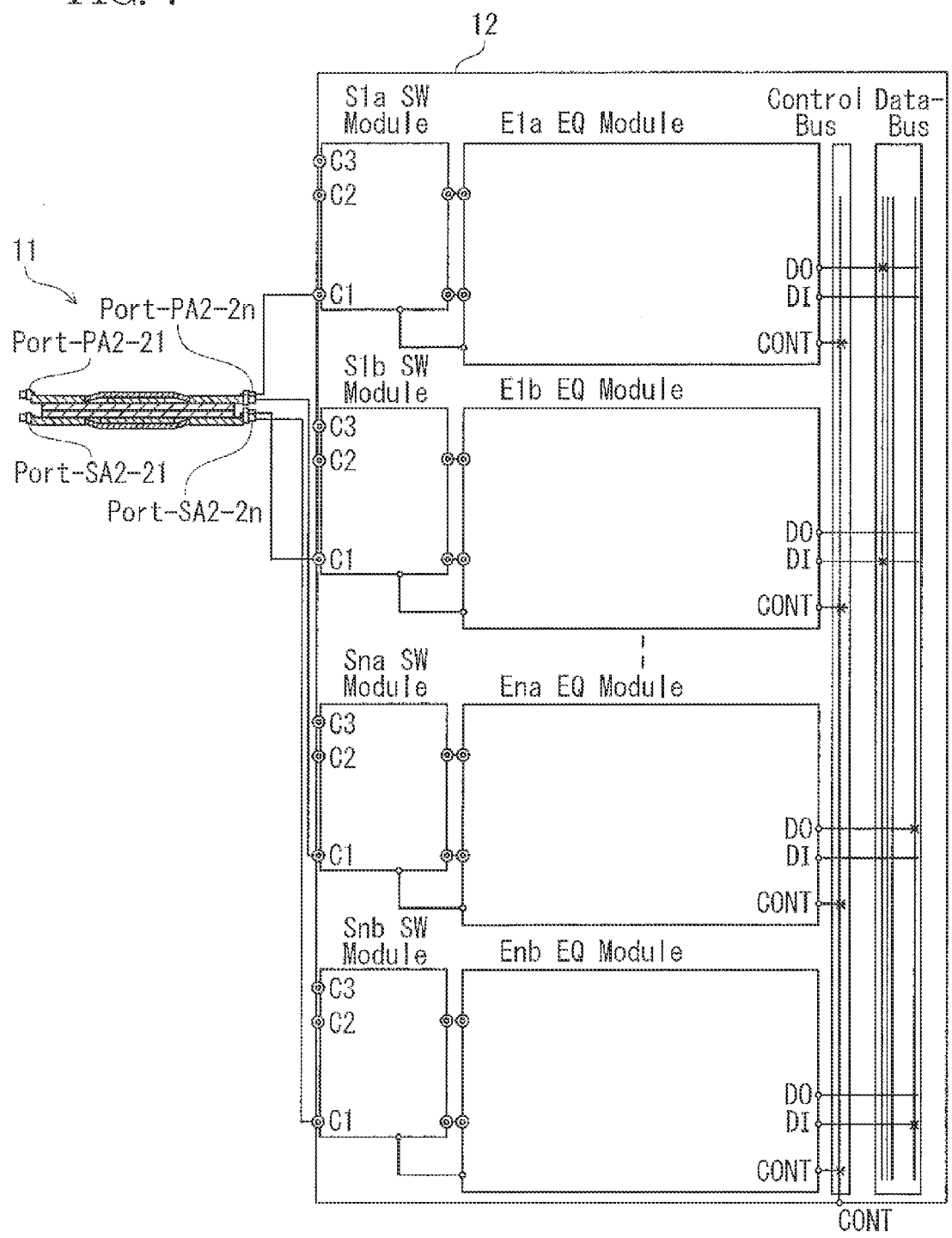
FIG. 7 shows the configuration of a signal compensation device of the transmission device according to the embodiment of the invention.

FIG. 7 shows the configuration of the signal compensation device 12 of the transmission device 1 according to the embodiment of the invention. As shown in FIG. 7, switch modules S1a, S1b, ..., Sna, Snb are connected to the adapter board connectors (Port) of the adapter device 11 one to one by coaxial cables having the same length. Equalizer modules E1a, E1b, ..., Ena, Enb are connected to the switch modules S1a, S1b, ..., Sna, Snb one to one. Where the number of probe-card-side terminals and the number of socket-board-side terminals of the adapter device 11 is n, the switch modules S1a-Sna are connected to the upper ports having Nos. 1-n, respectively. Likewise, the switch modules S1b-Snb are connected to the lower ports having Nos. 1-n, respectively.

The signal compensation device 12 is equipped with changeover switches for switching the signal transmission/reception directions between the above terminal groups. More specifically, data outputs DO and data inputs DI of the equalizer modules E1a, E1b, ..., Ena, Enb are connected to a data bus and the signal traveling directions and the line connections for the adapter device 11 can be changed by newly setting the crossing points of the data bus. A signal that is output from the upper port No. 1 of the adapter device 11 is input to the equalizer module E1b via the switch module S1a and the equalizer module E1a and then input to the lower port No. 1 of the adapter device 11 via the switch module S1b. Similar wiring is made for each of the other line numbers 2-n.

Figure 8:
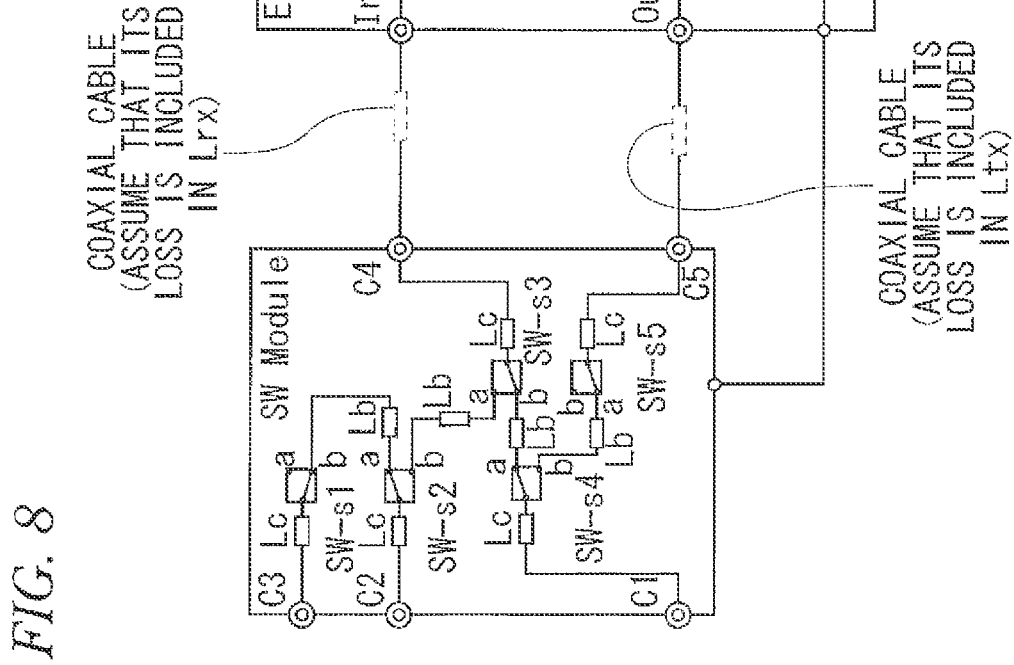
FIG. 8 shows the configuration of each set of a switch module and an equalizer module of the signal compensation device of the transmission device according to the embodiment of the invention.

FIG. 8 shows the configuration of each set of a switch module and an equalizer module of the signal compensation device 12 of the transmission device 1 according to the embodiment of the invention.

The switch module (SW Module) is composed of high-frequency switches SW-s1 to SW-s5. The passage loss on each of the connecting point a side and the connecting point b side of each of the switches SW-s1 to SW-s5 is represented by Lsws (dB). Symbol Lc denotes a transmission line between a connector and a corresponding one of the switches SW-s1 to SW-s5 and also represents its passage loss in dB. Likewise, Symbol Lb denotes a transmission line between connected ones of the switches SW-s1 to SW-s5 and also represents its passage loss in dB. It is assumed that the switch module is manufactured so that the transmission losses Lc are completely the same and also the transmission losses Lb are completely the same. To satisfy this manufacturing condition, a loss compensation circuit may be inserted in each of the transmission lines Lb and Lc.

The equalizer module (EQ Module) is equipped with an input buffer amplifier (linear amplifier) Ai having an input/output impedance 50Ω and a gain 0 dB, an AD converter (ADC), and equalizers EQ-SW, EQ-PA, EQ-A, and EQ-IC which are FIR filters. The number of equalizer stages may be determined according to the calibration accuracy. The Equalizer EQ-SW is an equalizer for compensating for a transmission loss 2×Lsws+Lb+2×Lc (i.e., transmission losses of two switches SW-s, one transmission line Lb, and two transmission lines Lc). The equalizer EQ-PA is an equalizer for compensating for a transmission loss Lppa (dB) or Lspa (dB) of the partner adapter board. The equalizer EQ-A is an equalizer for compensating for a transmission loss Lpa (dB) or Lsa (dB) of the adapter board. The equalizer EQ-IC is an equalizer for compensating the transmission characteristic of the transmission line from an input connector In1 to the output of the AD converter (ADC) in the equalizer module.

The equalizer module is also equipped with equalizer bypass switches BE-SW, BE-PA, and BE-A, an equalizer register (EQ Register), an equalizer controller (EQ Cont.), a memory MEM, a reference signal waveform data storage memory (Ref WFD), a fast Fourier transformers FFT1 and FFT2, and a spectrum comparator (Comparator).

The equalizer module is also equipped with pre-emphasis units PE-IC, PE-A, and PE-PA which are FIR filters. The number of pre-emphasis unit stages may be determined according to the calibration accuracy. The pre-emphasis unit PE-PA is a pre-emphasis unit for compensating for a transmission loss of the partner adapter board that is paired with the adapter board. The pre-emphasis unit PE-A is a pre-emphasis unit for compensating for a transmission loss of the adapter unit. The pre-emphasis unit PE-IC is a pre-emphasis unit for compensating the transmission characteristic of the transmission line from the input of a DA converter (DAC) to an output connector Out1.

The equalizer module is further equipped with a pre-emphasis bypass switch BP-PA, a pre-emphasis register (PE register), a pre-emphasis controller (PE Cont.), the DA converter (DAC), an output buffer amplifier (linear amplifier) Ao having an input/output impedance 50Ω and a gain 0 dB, and a controller.

The losses of the transmission lines in the signal compensation device 12 are defined as follows. The sum of the loss of the coaxial cable from the connector C4 of the switch module to the input connector In1 of the equalizer module and the loss of the transmission line from the input connector In1 to the input buffer amplifier Ai is represented by L1 (dB). The loss of the transmission line from the output of the input buffer amplifier Ai to the input of the AD converter (ADC) is represented by L2 (dB). The loss of the transmission line from the output of the DA converter (DAC) to the input of the output buffer amplifier Ao is represented by L3 (dB). The sum of the loss of the transmission line from the output of the output buffer amplifier Ao to the output connector Out1 of the equalizer module and the loss of the coaxial cable from the output connector Out1 to the connector C5 of the switch module is represented by L4 (dB). The total loss of the coaxial cable loss, the loss L1, the gain of the input buffer amplifier Ai, the loss L2, the loss of the AD converter (ADC), and the loss of other reception paths excluding the equalizers is represented by Lrx (dB). The total loss of the loss of the DA converter (DAC), the loss L3, the gain of the output buffer amplifier Ao, the loss L4, the coaxial cable loss, and the loss of other transmission paths excluding the pre-emphasis units is represented by Ltx (dB).

Next, a description will be made of gain adjusting methods in the signal compensation device 12 of the transmission device 1 according to the embodiment of the invention.

Figure 9:
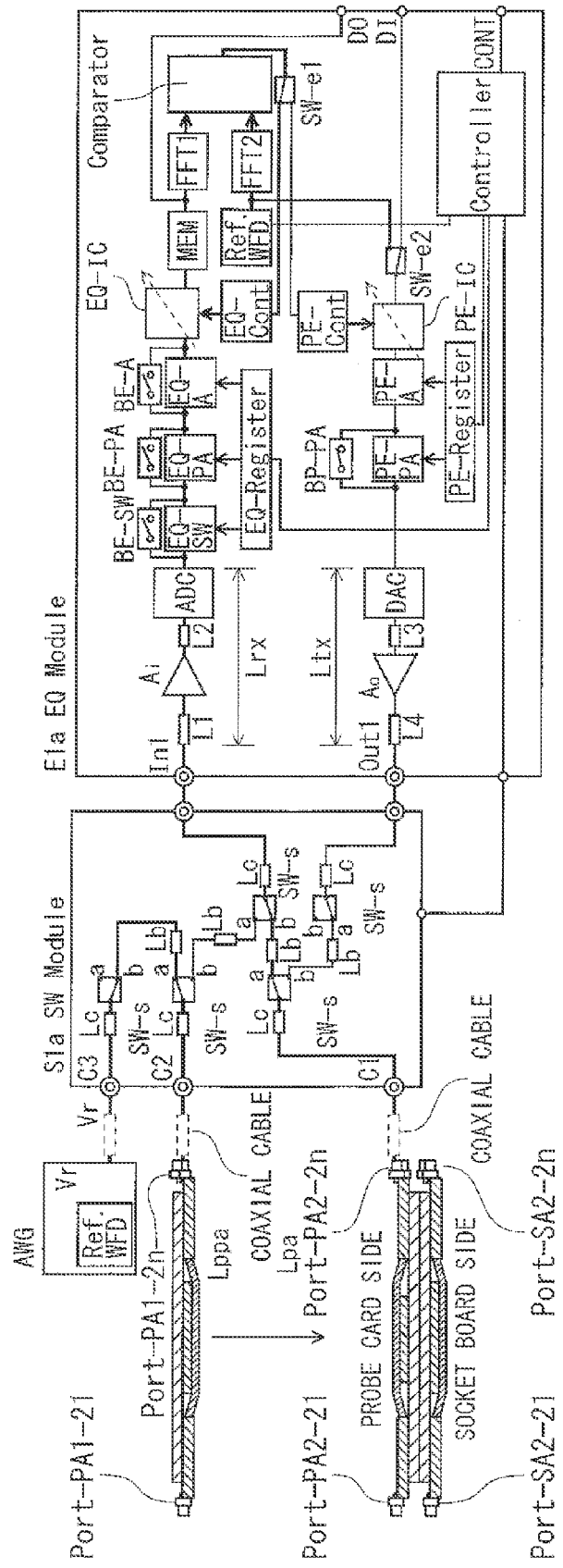
FIG. 9 is a circuit diagram for description of a gain adjusting method for a signal reception path in the signal compensation device of the transmission device according to the embodiment of the invention.

FIG. 9 is a circuit diagram for description of a gain adjusting method for a signal reception path in the signal compensation device 12 of the transmission device 1 according to the embodiment of the invention. The gain of the equalizer EQ-IC is adjusted in the following manner so that the transmission loss in the equalizer module (EQ Module) of the signal compensation device 12 in a signal reception path for reception of a signal by the probe-card-side adapter board can be compensated for.

The following assumptions are made in connection with the gain adjustment. The transmission loss of the partner adapter board is Lppa (dB) and an equalizing characteristic for compensating for the loss Lppa is set in the equalizer EQ-PA of the equalizer module in advance by the equalizer register (EQ Register). The transmission loss of the probe-card-side adapter board is Lpa (dB) and an equalizing characteristic for compensating for the loss Lpa is set in the equalizer EQ-A of the equalizer module in advance by the equalizer register. The losses Lppa and Lpa are known as a result of an advance measurement on the adapter device 11, and they are identical. The transmission loss 2×Lsws+2×Lc+Lb (dB) of the switches and the transmission lines between the switches of the switch module (SW Module) is known and an equalizing characteristic for compensating for the transmission loss 2×Lsws+2×Lc+Lb is set in the equalizer EQ-SW of the equalizer module in advance by the equalizer register. A signal waveform that is output from a calibration reference signal source AWG is the same as a signal waveform (waveform data) stored in the reference signal waveform data storage memory (Ref WFD) of the equalizer module. Each of the losses Lppa and Lpa includes the loss of the corresponding one of the coaxial cables (having the same length) that connect the adapter device 11 and the switch module.

On the above assumptions, a gain adjustment is performed in the following manner Among the signal lines shown in FIG. 9, signal lines that transmit a reference signal are drawn by thick lines.

As shown in FIG. 9, a reference signal is transmitted by the signal path from the reference signal source AWG to the output of the fast Fourier transformer FFT1 (indicated by thick lines in FIG. 9) with the bypass switches BE-SW, BE-PA, and BE-A opened. More specifically, a reference signal generated by the reference signal source AWG is input to the signal compensation device 12 via the connector C3, passes the two transmission lines Lc, the two switches SW-s, and the one transmission line Lb of the switch module, and is output from the connector C2. Then, the reference signal passes through the partner adapter board and the probe-card-side adapter board, is input to the signal compensation device 12 via the connector C1, passes the two transmission lines Lc, the two switches SW-s, and the one transmission line Lb of the switch module, and is output from the switch module. Then, the reference signal is input to the equalizer module via the connector In1 and input to the fast Fourier transformer FFT1 via the transmission line L1, the input buffer amplifier Ai, the transmission line L2, the AD converter (ADC), the equalizers EQ-SW, EQ-PA, EQ-A, and EQ-IC, and the memory MEM.

On the other hand, reference signal waveform data that is read from the memory (Ref WFD) and is the same as the reference signal waveform data generated by the reference signal source AWG is input to the fast Fourier transformer FFT2 and converted into a frequency spectrum there.

The spectrum comparator (Comparator) compares frequency components of the reference signal that is output from the fast Fourier transformer FFT1 and frequency components of the reference signal that is output from the fast Fourier transformer FFT2. And the equalizing characteristic of the equalizer EQ-IC is adjusted by controlling the equalizer controller (EQ Cont.) so that the level difference in the frequency band between the reference signals becomes zero. An example adjusting method is a least mean square (LMS) method.

Jitter calibration values can be changed easily merely by rewriting the reference signal waveform data that is generated in the signal compensation device 12 of the transmission device 1 according to the embodiment of the invention.

The condition that the total transmission loss of the above-described signal path should be zero is expressed by Equation (24) using the gains and losses of the individual elements.

$$2 \times Lc + 2 \times Lsws + Lb + Lppa + Lpa + 2 \times Lc + 2 \times Lsws + Lb + Lrx + Gesw + Gepa + Gea + Geic = 0 \quad (24)$$

Rearranging Equation (24), Equation (25) is obtained.

$$(2 \times Lc + 2 \times Lsws + Lb + Gesw) + (Lppa + Gepa) + \\ (Lpa + Gea) + (2 \times Lc + 2 \times Lsws + Lb + Lrx + Geic) = 0 \quad (25)$$

Calibration conditions that are represented by Equations (26) are substituted into Equation (25), whereby a characteristic (gain Geic) of the equalizer EQ-IC is determined as expressed by Equation (27). This value is held.

$$Lppa = -Gepa, Lpa = -Gea,$$

$$(2 \times Lc + 2 \times Lsws + Lb) = -Gesw \quad (26)$$

$$Geic = -(2 \times Lc + 2 \times Lsws + Lb + Lrx) \quad (27)$$

Figure 10:
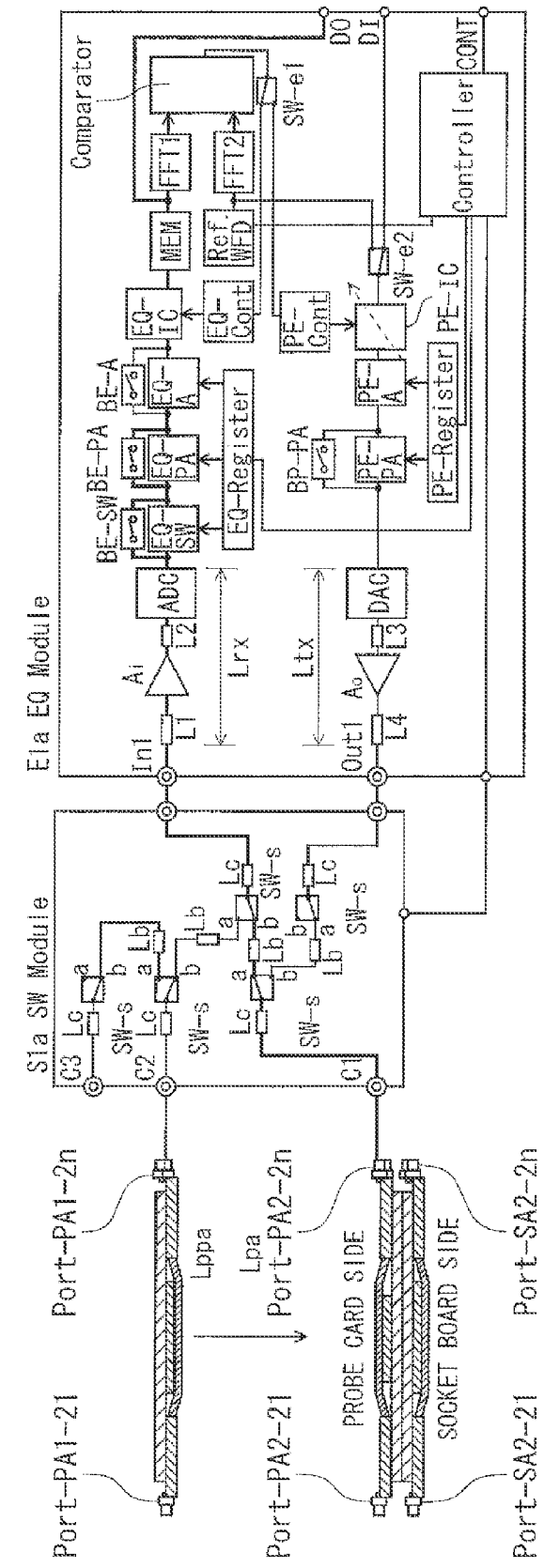
FIG. 10 is a circuit diagram for description of an effect of a gain that is set by the gain adjusting method of FIG. 9.

FIG. 10 is a circuit diagram for description of an effect of the gain that is set by the gain adjusting method described above with reference to FIG. 9. Among the signal lines shown in FIG. 10, signal lines that transmit a reference signal are drawn by thick lines. A transmission-loss-compensation signal path from a terminal (pad tip) of the probe-card-side adapter board of the adapter device 11 to the reception output DO of the equalizer module (EQ Module) of the signal compensation device 12 is indicated by the thick signal lines. The equalizer bypass switches BE-SW and BE-PA are closed and hence the equalizers EQ-SW and EQ-PA are bypassed. It is understood that the total transmission loss of the signal path from the terminal (pad tip) of the probe-card-side adapter board of the adapter device 11 to the reception output DO of the equalizer module (EQ Module) of the signal compensation device 12 is made zero as expressed by Equation (29) by using the gain Geic of the equalizer EQ-IC shown in Equation (28) that is set by the gain adjusting method of FIG. 9.

$$Lpa = -Gea, \\ Geic = -(2 \times Lc + 2 \times Lsws + Lb + Lrx) \quad (28)$$

$$Lpa + 2 \times Lc + 2 \times Lsws + Lb + Lrx + Gea + Geic = \\ (Lpa + Gea) + (2 \times Lc + 2 \times Lsws + Lb + Lrx + Geic) = 0 \quad (29)$$

Figure 11:
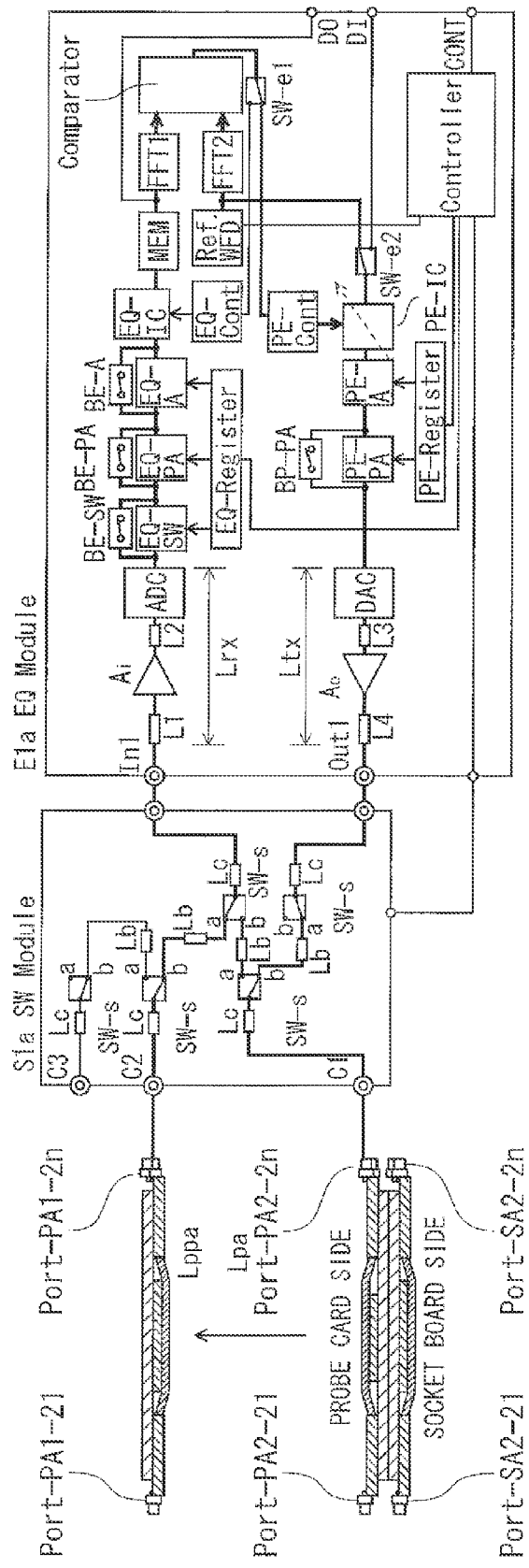
FIG. 11 is a circuit diagram for description of a gain adjusting method for a signal sending path in the signal compensation device of the transmission device according to the embodiment of the invention.

FIG. 11 is a circuit diagram for description of a gain adjusting method for a signal sending path in the signal compensation device 12 of the transmission device 1 according to the embodiment of the invention. The gain of the pre-emphasis unit PE-IC is adjusted in the following manner so that the transmission loss in the equalizer module (EQ Module) of the signal compensation device 12 in a signal sending path for sending of a signal from the probe-card-side adapter board can be compensated for in advance.

The following assumptions are made in connection with the gain adjustment. The transmission loss of the partner adapter board is Lppa (dB) and an emphasis characteristic for compensating for the loss Lppa is set in the pre-emphasis unit PE-PA of the equalizer module in advance by the pre-emphasis register (PE register). The transmission loss of the probe-card-side adapter board is Lpa (dB) and an emphasis characteristic for compensating for the loss Lpa is set in the pre-emphasis unit PE-A of the equalizer module in advance by the pre-emphasis register. Each of the losses Lppa and Lpa includes the loss of the corresponding one of the coaxial cables (having the same length) that connect the adapter device 11 and the switch module (SW Module).

On the above assumptions, a gain adjustment is performed in the following manner. Among the signal lines shown in FIG. 11, signal lines that transmit a reference signal are drawn by thick lines.

As shown in FIG. 11, a reference signal is transmitted by the signal path from the reference signal waveform data storage memory (Ref WFD) to the output of the fast Fourier transformer FFT1 (indicated by thick lines in FIG. 11) with the bypass switch BP-PA opened, and is converted into a frequency spectrum by the fast Fourier transformer FFT1. More specifically, a reference signal read from the memory (Ref WFD) passes the switch SW-e2, the pre-emphasis units PE-IC, PE-A, and PE-PA, the DA converter (DAC), the transmission line L3 of the switch module, the output buffer amplifier Ao, and the transmission line L4, and is output from the connector Out1 to the switch module. The reference signal passes the two transmission lines Lc, the two switches SW-s, and the one transmission line Lb of the switch module and is output from the connector C1. Then, the reference signal passes through the probe-card-side adapter board and the partner adapter board, is input to the signal compensation device 12 via the connector C2, passes the two transmission lines Lc, the two switches SW-s, and the one transmission line Lb of the switch module, and is output from the switch module. Then, the reference signal is input to the equalizer module via the connector In1 and input to the fast Fourier transformer FFT1 via the transmission line L1, the input buffer amplifier Ai, the transmission line L2, the AD converter (ADC), the bypass switches BE-SW, BE-PA, and BE-A, the equalizer EQ-IC, and the memory MEM.

On the other hand, the reference signal waveform data that is read from the memory (Ref WFD) is input to the fast Fourier transformer FFT2 and converted into a frequency spectrum there.

The spectrum comparator (Comparator) compares frequency components of the reference signal that is output from the fast Fourier transformer FFT1 and frequency components of the reference signal that is output from the fast Fourier transformer FFT2. And the pre-emphasis characteristic of the pre-emphasis unit PE-IC is adjusted by controlling the pre-emphasis controller (PE Cont.) so that the level difference in the frequency band between the reference signals becomes zero. An example adjusting method is a least mean square (LMS) method.

The condition that the total transmission loss of the above-described signal path should be zero is expressed by Equation (30) using the gains and losses of the individual elements.

$$Gpic+Gpa+Gppa+Ltx+2\times Lc+2\times Lsws+Lb+Lpa+Lppa+2\times Lc+2\times Lsws+Lb+Lrx+Geic=0 \quad (30)$$

Rearranging Equation (30), Equation (31) is obtained.

$$Gpic + (Gpa + Lpa) + \quad (31)$$
$$(Gppa + Lppa) + (Ltx + 2 \times Lc + 2 \times Lsws + Lb) +$$
$$(2 \times Lc + 2 \times Lsws + Lb + Lrx + Geic) = 0$$

Calibration conditions that are represented by Equations (32) are substituted into Equation (31), whereby Equation (33) is obtained.

$$Lppa=-Gppa, Lpa=-Gpa,$$
$$(2\times Lc+2\times Lsws+Lb+Lrx)=-Geic \quad (32)$$

$$Gpic+2\times Lc+2\times Lsws+Lb+Ltx=0 \quad (33)$$

Rearranging Equation (33), a characteristic (gain Gpic) of the pre-emphasis unit PE-IC is determined as expressed by Equation (34). This value is held.

$$Gpic=-(2\times Lc+2\times Lsws+Lb+Ltx) \quad (34)$$

Figure 12:
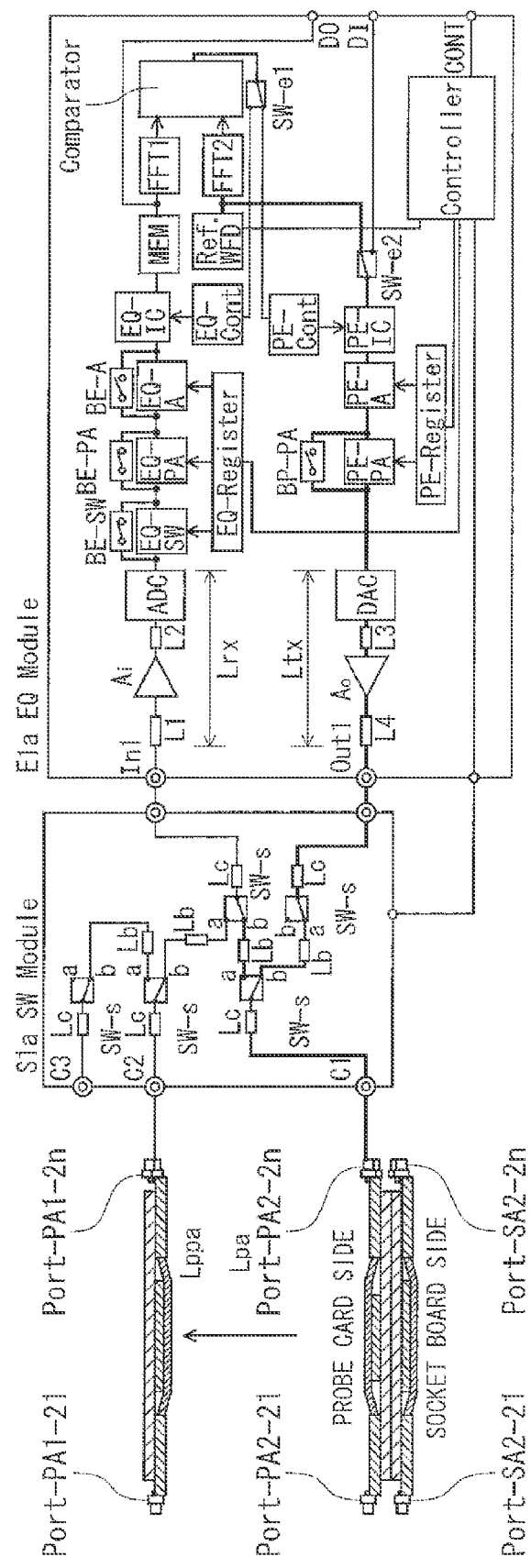
FIG. 12 is a circuit diagram for description of an effect of a gain that is set by the gain adjusting method of FIG. 11.

FIG. 12 is a circuit diagram for description of an effect of the gain that is set by the gain adjusting method described above with reference to FIG. 11. Among the signal lines shown in FIG. 12, signal lines that transmit a reference signal are drawn by thick lines. A transmission-loss-compensation signal path from the reference signal waveform data storage memory (Ref WFD) of the equalizer module (EQ Module) of the signal compensation device 12 to a terminal (pad tip) of the probe-card-side adapter board of the adapter device 11 is indicated by the thick signal lines. The pre-emphasis bypass switches BP-PA is closed and hence the pre-emphasis unit PE-PA is bypassed. It is understood that the total transmission loss of the signal path from the memory (Ref WFD) of the equalizer module of the signal compensation device 12 to the terminal (pad tip) of the probe-card-side adapter board of the adapter device 11 is made zero as expressed by Equation (36) by using the gain Gpic of the pre-emphasis unit PE-IC shown in Equation (35) that is set by the gain adjusting method of FIG. 11.

$$Lpa = -Gpa, \quad (35)$$
$$Gpic = -(2 \times Lc + 2 \times Lsws + Lb + Ltx)$$

$$Gpic + Gpa + Ltx + 2 \times Lc + 2 \times Lsws + Lb + Lpa = \quad (36)$$
$$(Gpic + 2 \times Lc + 2 \times Lsws + Lb + Ltx) + (Gpa + Lpa) = 0$$

Whereas the above gain adjusting methods are directed to the probe-card-side adapter board, similar gain adjusting methods are applicable to the socket-board-side adapter board.

Figure 13:
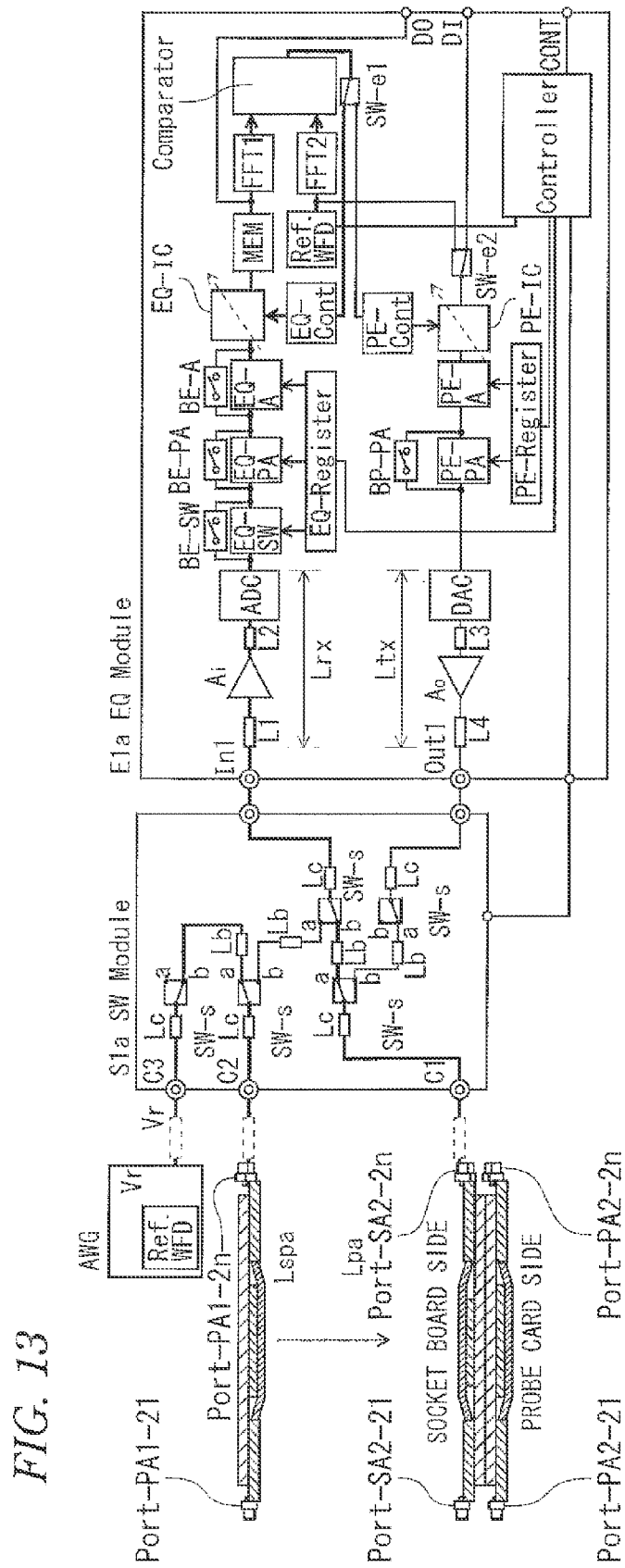
FIG. 13 is a circuit diagram for description of a gain adjusting method for a signal reception path in the signal compensation device of the transmission device according to the embodiment of the invention.

FIG. 13 is a circuit diagram for description of a gain adjusting method for a signal reception path in the signal compensation device 12 of the transmission device 1 according to the embodiment of the invention. The gain of the equalizer EQ-IC is adjusted in the following manner so that the transmission loss in the equalizer module (EQ Module) of the signal compensation device 12 in a signal reception path for reception of a signal by the socket-board-side adapter board can be compensated for.

The following assumptions are made in connection with the gain adjustment. The transmission loss of the partner adapter board is Lspa (dB) and an equalizing characteristic for compensating for the loss Lspa is set in the equalizer EQ-PA of the equalizer module in advance by the equalizer register (EQ Register). The transmission loss of the socket-board-side adapter board is Lsa (dB) and an equalizing characteristic for compensating for the loss Lsa is set in the equalizer EQ-A of the equalizer module in advance by the equalizer register. The losses Lspa and Lsa are known as a result of an advance measurement on the adapter device 11, and they are identical. The transmission loss 2×Lsws+2×Lc+Lb (dB) of the switches and the transmission lines between the switches of the switch module (SW Module) is known and an equalizing characteristic for compensating for the transmission loss 2×Lsws+2×Lc+Lb is set in the equalizer EQ-SW of the equalizer module in advance by the equalizer register. A signal waveform that is output from the calibration reference signal source AWG is the same as a signal waveform (waveform data) stored in the reference signal waveform data storage memory (Ref WFD) of the equalizer module. Each of the losses Lspa and Lsa includes the loss of the corresponding one of the coaxial cables (having the same length) that connect the adapter device 11 and the switch module.

On the above assumptions, a gain adjustment is performed in the following manner. Among the signal lines shown in FIG. 13, signal lines that transmit a reference signal are drawn by thick lines.

As shown in FIG. 13, a reference signal is transmitted by the signal path from the reference signal source AWG to the output of the fast Fourier transformer FFT1 (indicated by thick lines in FIG. 13) with the bypass switches BE-SW, BE-PA, and BE-A opened. More specifically, a reference signal generated by the reference signal source AWG is input to the signal compensation device 12 via the connector C3, passes the two transmission lines Lc, the two switches SW-s, and the one transmission line Lb of the switch module, and is output from the connector C2. Then, the reference signal passes through the partner adapter board and the socket-board-side adapter board, is input to the signal compensation device 12 via the connector C1, passes the two transmission lines Lc, the two switches SW-s, and the one transmission line Lb of the switch module, and is output from the switch module. Then, the reference signal is input to the equalizer module via the connector In1 and input to the fast Fourier transformer FFT1 via the transmission line L1, the input buffer amplifier Ai, the transmission line L2, the AD converter (ADC), the equalizers EQ-SW, EQ-PA, EQ-A, and EQ-IC, and the memory MEM.

On the other hand, reference signal waveform data that is read from the memory (Ref WFD) and is the same as the reference signal waveform data generated by the reference signal source AWG is input to the fast Fourier transformer FFT2 and converted into a frequency spectrum there.

The spectrum comparator (Comparator) compares frequency components of the reference signal that is output from the fast Fourier transformer FFT1 and frequency components of the reference signal that is output from the fast Fourier transformer FFT2. And the equalizing characteristic of the equalizer EQ-IC is adjusted by controlling the equalizer controller (EQ Cont.) so that the level difference in the frequency band between the reference signals becomes zero. An example adjusting method is a least mean square (LMS) method.

The condition that the total transmission loss of the above-described signal path should be zero is expressed by Equation (37) using the gains and losses of the individual elements.

$$2 \times Lc + 2 \times Lsws + Lb + Lspa + Lsa + 2 \times Lc + 2 \times Lsws + Lb + Lrx + Gesw + Gepa + Gea + Geic = 0 \quad (37)$$

Rearranging Equation (37), Equation (38) is obtained.

$$(2 \times Lc + 2 \times Lsws + Lb + Gesw) + (Lsa + Gea) + \\ (Lspa + Gepa) + (2 \times Lc + 2 \times Lsws + Lb + Lrx + Geic) = 0 \quad (38)$$

Calibration conditions that are represented by Equations (39) are substituted into Equation (38), whereby Equation (40) is obtained.

$$Lspa = -Gepa, Lsa = -Gea,$$

$$(2 \times Lc + 2 \times Lsws + Lb) = -Gesw \quad (39)$$

$$2 \times Lc + 2 \times Lsws + Lb + Lrx + Geic = 0 \quad (40)$$

Rearranging Equation (40), a characteristic (gain Geic) of the equalizer EQ-IC is determined as expressed by Equation (41). This value is held.

$$Geic = -(2 \times Lc + 2 \times Lsws + Lb + Lrx) \quad (41)$$

Figure 14:
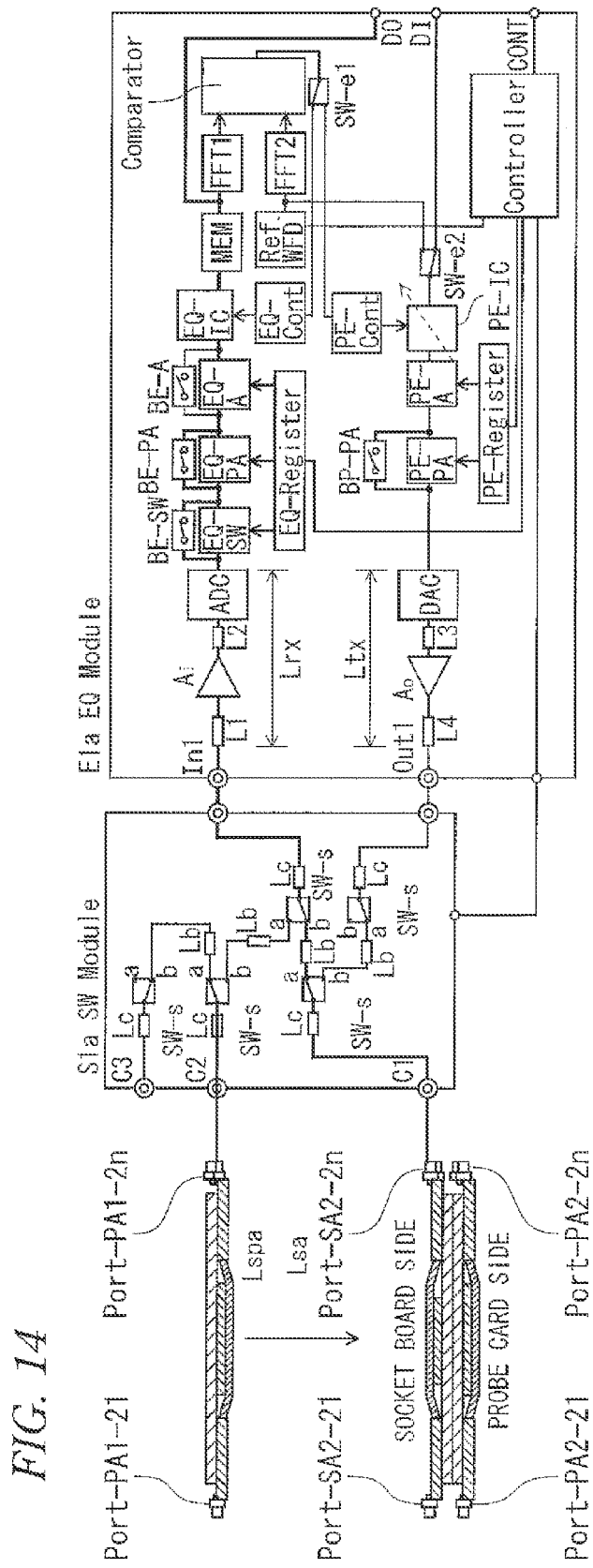
FIG. 14 is a circuit diagram for description of an effect of a gain that is set by the gain adjusting method of FIG. 13.

FIG. 14 is a circuit diagram for description of an effect of the gain that is set by the gain adjusting method described above with reference to FIG. 13. Among the signal lines shown in FIG. 14, signal lines that transmit a reference signal are drawn by thick lines. A transmission-loss-compensation signal path from a terminal (pad tip) of the socket-board-side adapter board of the adapter device 11 to the reception output DO of the equalizer module (EQ Module) of the signal compensation device 12 is indicated by the thick signal lines. The equalizer bypass switches BE-SW and BE-PA are closed and hence the equalizers EQ-SW and EQ-PA are bypassed. It is understood that the total transmission loss of the signal path from the terminal (pad tip) of the socket-board-side adapter board of the adapter device 11 to the reception output DO of the equalizer module (EQ Module) of the signal compensation device 12 is made zero as expressed by Equation (43) by using the gain Geic of the equalizer EQ-IC shown in Equation (42) that is set by the gain adjusting method of FIG. 13.

$$Lsa = -Gea, \\ Geic = -(2 \times Lc + 2 \times Lsws + Lb + Lrx) \quad (42)$$

$$Lsa + 2 \times Lc + 2 \times Lsws + Lb + Lrx + Gea + Geic = \\ (Lsa + Gea) + (2 \times Lc + 2 \times Lsws + Lb + Lrx + Geic) = \\ 2 \times Lc + 2 \times Lsws + Lb + Lrx + Geic = 0 \quad (43)$$

Figure 15:
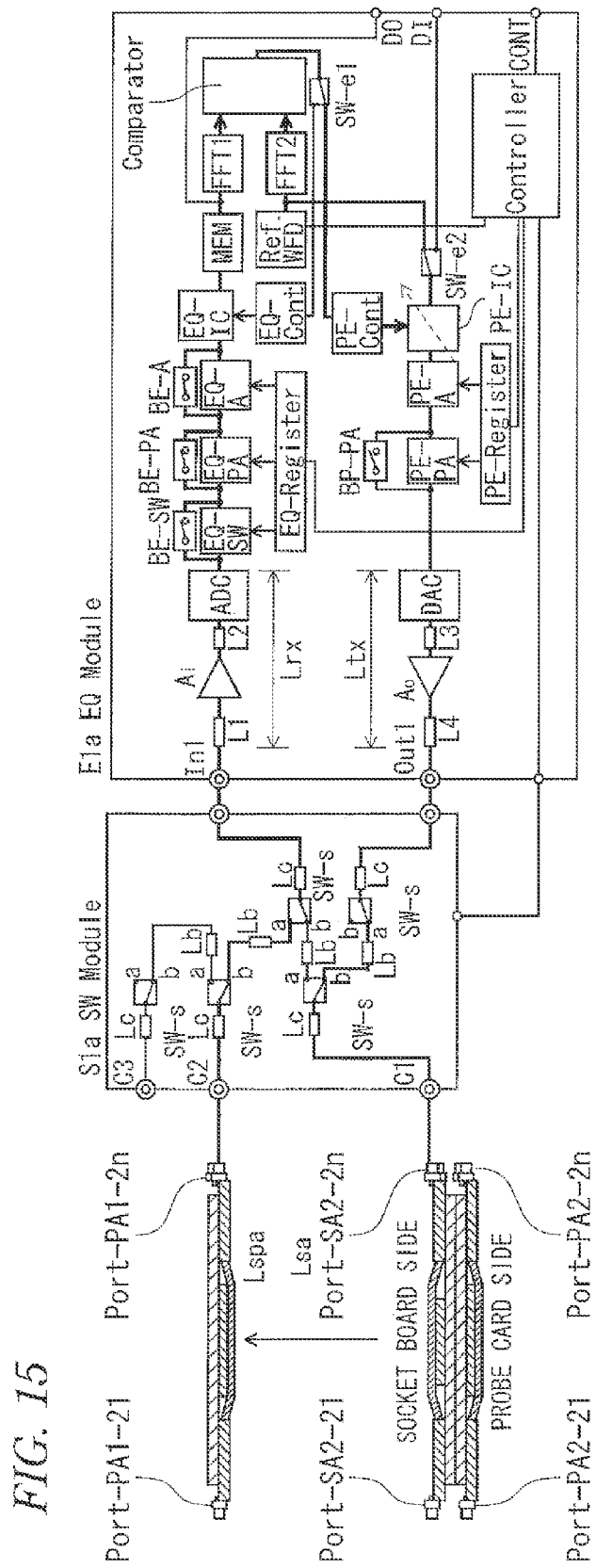
FIG. 15 is a circuit diagram for description of a gain adjusting method for a signal sending path in the signal compensation device of the transmission device according to the embodiment of the invention.

FIG. 15 is a circuit diagram for description of a gain adjusting method for a signal sending path in the signal compensation device 12 of the transmission device 1 according to the embodiment of the invention. The gain of the pre-emphasis unit PE-IC is adjusted in the following manner so that the transmission loss in the equalizer module (EQ Module) of the signal compensation device 12 in a signal sending path for sending of a signal from the socket-board-side adapter board can be compensated for in advance.

The following assumptions are made in connection with the gain adjustment. The transmission loss of the partner adapter board is Lspa (dB) and an emphasis characteristic for compensating for the loss Lspa is set in the pre-emphasis unit PE-PA of the equalizer module in advance by the pre-emphasis register (PE register). The transmission loss of the socket-board-side adapter board is Lsa (dB) and an emphasis characteristic for compensating for the loss Lsa is set in the pre-emphasis unit PE-A of the equalizer module in advance by the pre-emphasis register. Each of the losses Lspa and Lsa includes the loss of the corresponding one of the coaxial cables (having the same length) that connect the adapter device 11 and the switch module (SW Module).

On the above assumptions, a gain adjustment is performed in the following manner. Among the signal lines shown in FIG. 15, signal lines that transmit a reference signal are drawn by thick lines.

As shown in FIG. 15, a reference signal is transmitted by the signal path from the reference signal waveform data storage memory (Ref WFD) to the output of the fast Fourier transformer FFT1 (indicated by thick lines in FIG. 15) with the bypass switch BP-PA opened, and is converted into a frequency spectrum by the fast Fourier transformer FFT1. More specifically, a reference signal read from the memory (Ref WFD) passes the switch SW-e2, the pre-emphasis units PE-IC, PE-A, and PE-PA, the DA converter (DAC), the transmission line L3, the output buffer amplifier Ao, and the transmission line L4, and is output from the connector Out1 to the switch module. The reference signal passes the two transmission lines Lc, the two switches SW-s, and the one transmission line Lb of the switch module and is output from the connector C1. Then, the reference signal passes through the socket-board-side adapter board and the partner adapter board, is input to the signal compensation device 12 via the connector C2, passes the two transmission lines Lc, the two switches SW-s, and the one transmission line Lb of the switch module, and is output from the switch module. Then, the reference signal is input to the equalizer module via the connector In1 and input to the fast Fourier transformer FFT1 via the transmission line L1, the input buffer amplifier Ai, the transmission line L2, the AD converter (ADC), the bypass switches BE-SW, BE-PA, and BE-A, the equalizer EQ-IC, and the memory MEM.

On the other hand, the reference signal waveform data that is read from the memory (Ref WFD) is input to the fast Fourier transformer FFT2 and converted into a frequency spectrum there.

The spectrum comparator (Comparator) compares frequency components of the reference signal that is output from the fast Fourier transformer FFT1 and frequency components of the reference signal that is output from the fast Fourier transformer FFT2. And the pre-emphasis characteristic of the pre-emphasis unit PE-IC is adjusted by controlling the pre-emphasis controller (PE Cont.) so that the level difference in the frequency band between the reference signals becomes zero. An example adjusting method is a least mean square (LMS) method.

The condition that the total transmission loss of the above-described signal path should be zero is expressed by Equation (44) using the gains and losses of the individual elements.

$$Gpic+Gpa+Gppa+Ltx+2\times Lc+2\times Lsws+Lb+Lsa+Lspa+2\times Lc+2\times Lsws+Lb+Lrx+Geic=0 \quad (44)$$

Rearranging Equation (44), Equation (45) is obtained.

$$Gpic + (Lsa + Gpa) + \\ (Lspa + Gppa) + Ltx + (2 \times Lc + 2 \times Lsws + Lb) + \\ (2 \times Lc + 2 \times Lsws + Lb + Lrx + Geic) = 0 \quad (45)$$

Calibration conditions that are represented by Equations (46) are substituted into Equation (45), whereby Equation (47) is obtained.

$$Lspa=-Gppa, Lsa=-Gpa,$$

$$Geic=-(2\times Lc+2\times Lsws+Lb+Lrx) \quad (46)$$

$$Gpic+Ltx+2\times Lc+2\times Lsws+Lb=0 \quad (47)$$

Rearranging Equation (47), a characteristic (gain Gpic) of the pre-emphasis unit PE-IC is determined as expressed by Equation (48). This value is held.

$$Gpic=-(2\times Lc+2\times Lsws+Lb+Ltx) \quad (48)$$

Figure 16:
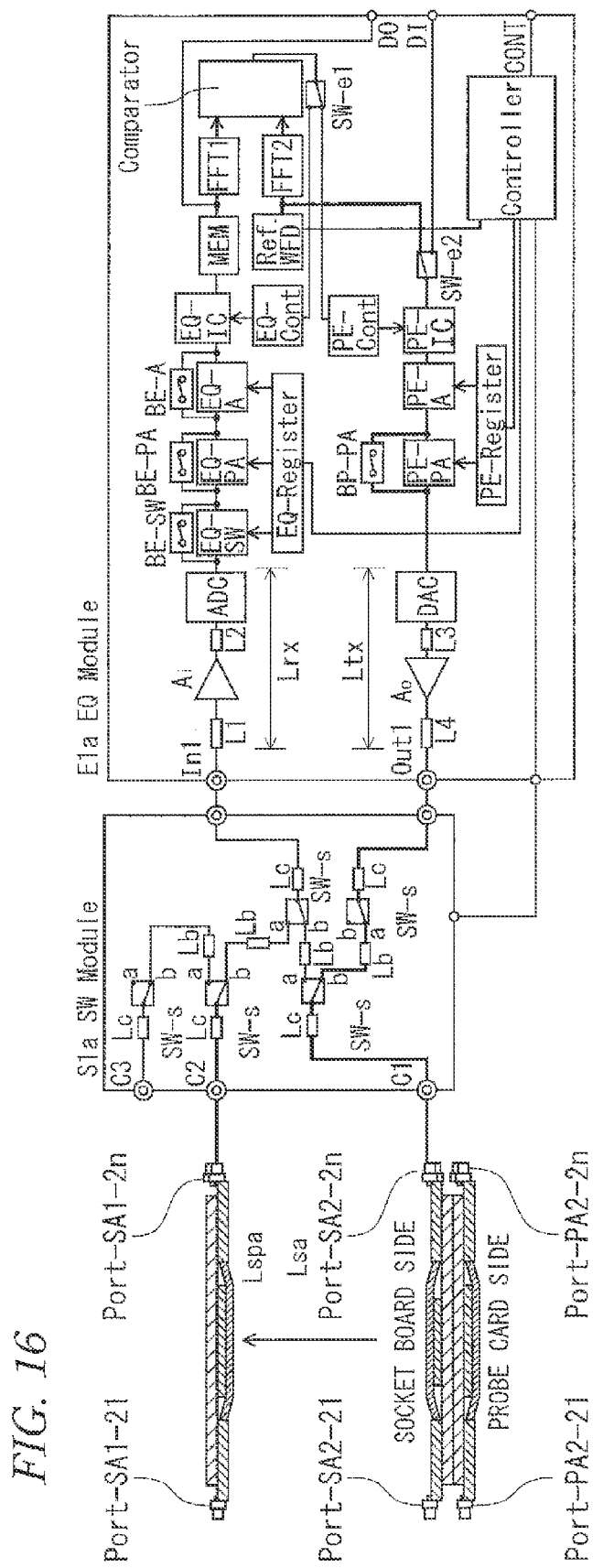
FIG. 16 is a circuit diagram for description of an effect of a gain that is set by the gain adjusting method of FIG. 15.

FIG. 16 is a circuit diagram for description of an effect of the gain that is set by the gain adjusting method described above with reference to FIG. 15. Among the signal lines shown in FIG. 16, signal lines that transmit a reference signal are drawn by thick lines. A transmission-loss-compensation signal path from the reference signal waveform data storage memory (Ref WFD) of the equalizer module (EQ Module) of the signal compensation device 12 to a terminal (pad tip) of the socket-board-side adapter board of the adapter device 11 is indicated by the thick signal lines. The pre-emphasis bypass switches BP-PA is closed and hence the pre-emphasis unit PE-PA is bypassed. It is understood that the total transmission loss of the signal path from the memory (Ref WFD) of the equalizer module of the signal compensation device 12 to the terminal (pad tip) of the socket-board-side adapter board of the adapter device 11 is made zero as expressed by Equation (50) by using the gain Gpic of the pre-emphasis unit PE-IC shown in Equation (49) that is set by the gain adjusting method of FIG. 15.

$$Lsa = -Gpa, \\ Gpic = -(2 \times Lc + 2 \times Lsws + Lb + Ltx) \quad (49)$$

$$Gpic + Gpa + Ltx + 2 \times Lc + 2 \times Lsws + Lb + Lsa = \\ (Gpic + 2 \times Lc + 2 \times Lsws + Lb + Ltx) + (Lsa + Gpa) = 0 \quad (50)$$

In the transmission device 1 according to the embodiment of the invention, the signal compensation devices 12 in which the gains have been adjusted in the above-described manners are connected to the probe-card-side adapter board and the socket-board-side adapter board of the adapter device 11 via separate sets of coaxial cables having the same length. The signal compensation device 12 for each adapter board compensates for transmission losses occurring in the adapter board and the coaxial cables connected to it and makes zero the transmission loss between each terminal of the terminal group of a probe-card-side adapter board and a corresponding terminal of the terminal group of the socket-side adapter board. Therefore, when the transmission device 1 according to the embodiment of the invention is used for jitter calibration of an evaluation instrument for evaluating the transmission characteristic of a transmission line, a "bypass state" that the probe terminals of a probe card are connected to the respective socket terminals of a socket board without intervention of the evaluation subject transmission line can be realized, which makes it possible to perform jitter calibration easily and correctly taking a test path into consideration. Furthermore, such correct jitter calibration enables more correct jitter measurement of an evaluation subject transmission line such as an IC package or an interposer in which the probe-side terminals and the socket-side terminals are different in pitch and size.

Figure 17:
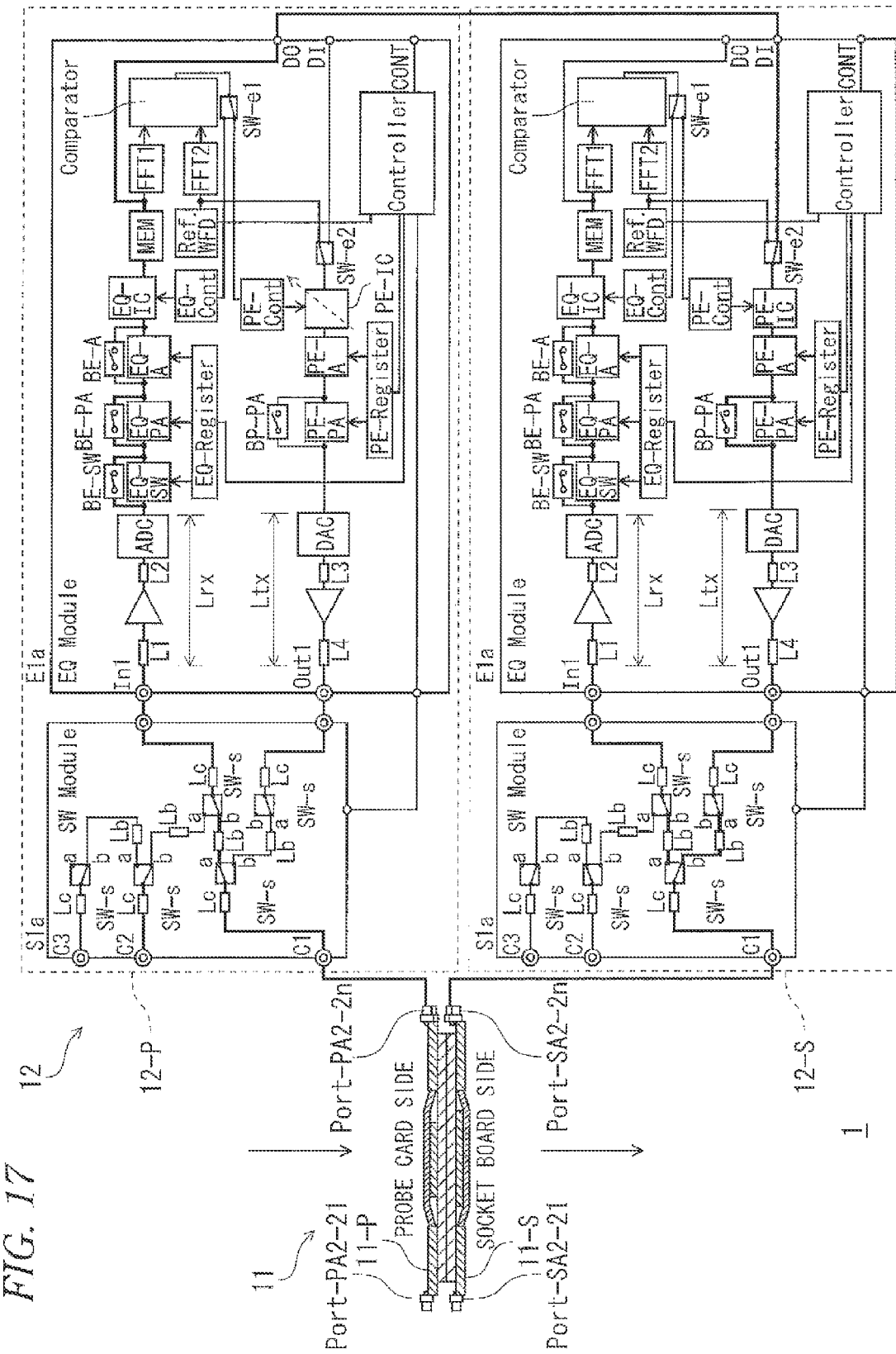
FIG. 17 is a first circuit diagram illustrating a signal flow in the transmission device according to the embodiment of the invention.
Figure 18:
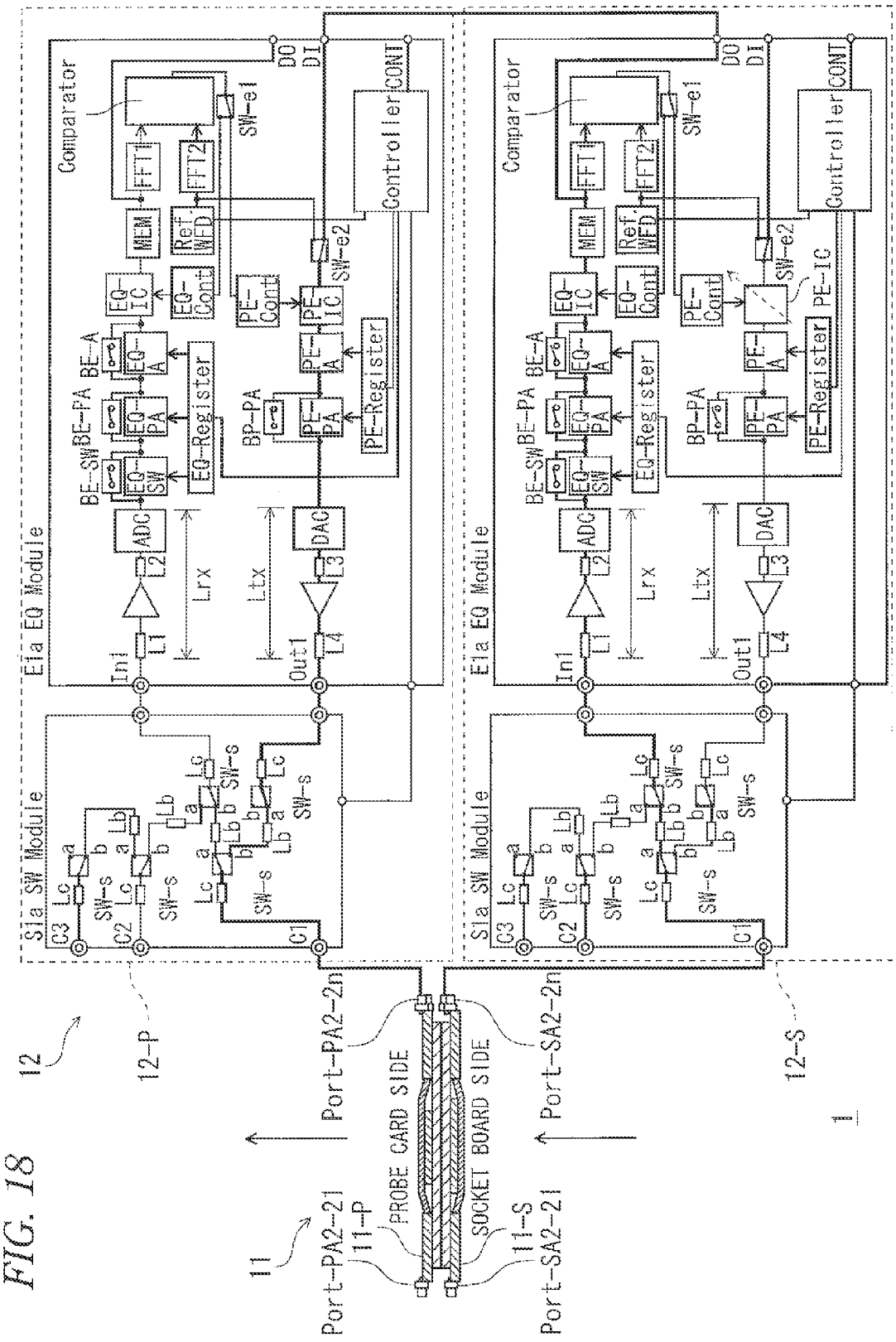
FIG. 18 is a second circuit diagram illustrating a signal flow in the transmission device according to the embodiment of the invention.
Figure 19:
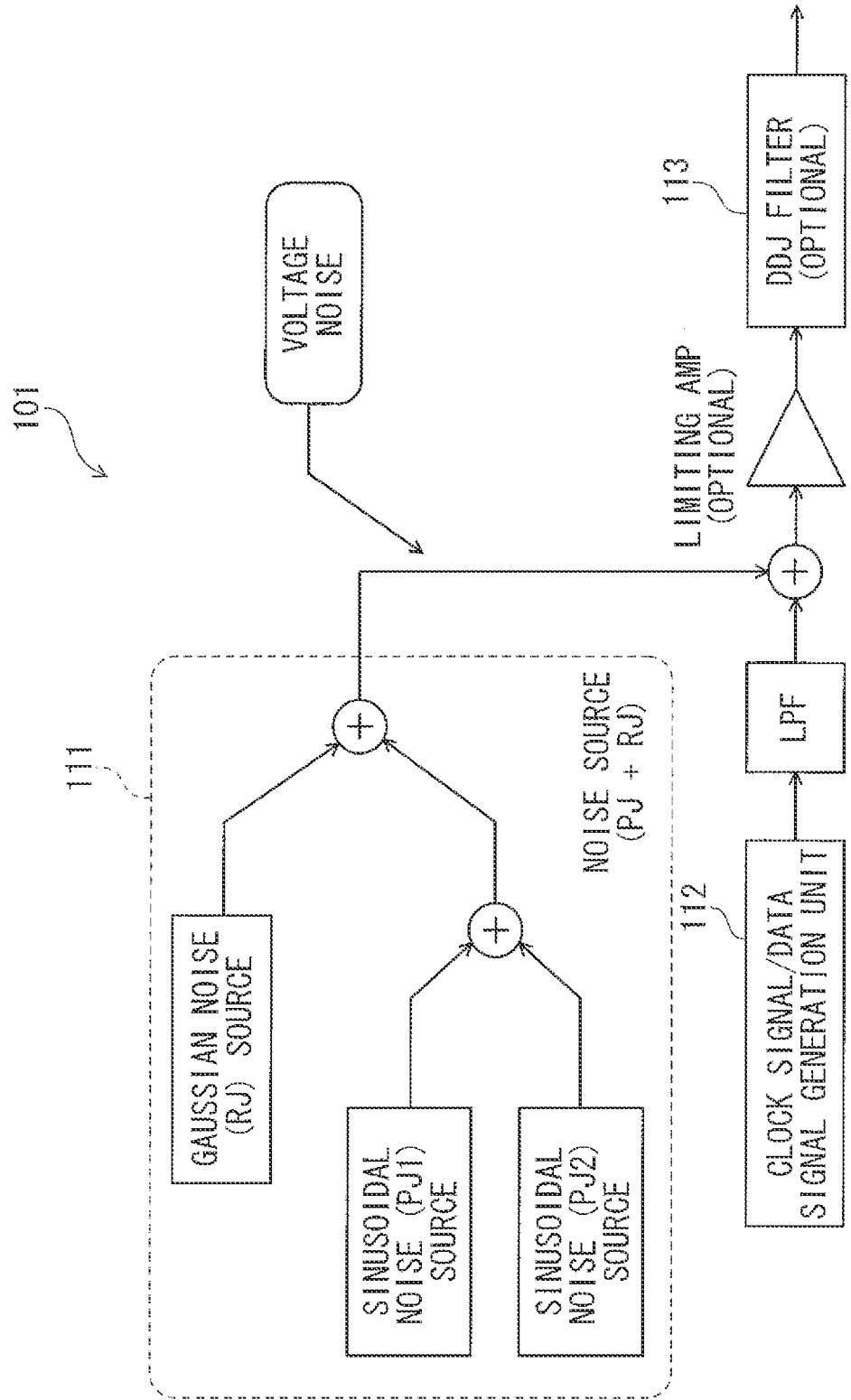
FIG. 19 is a block diagram of an example common test signal generator having a jitter generating function.
Figure 20:
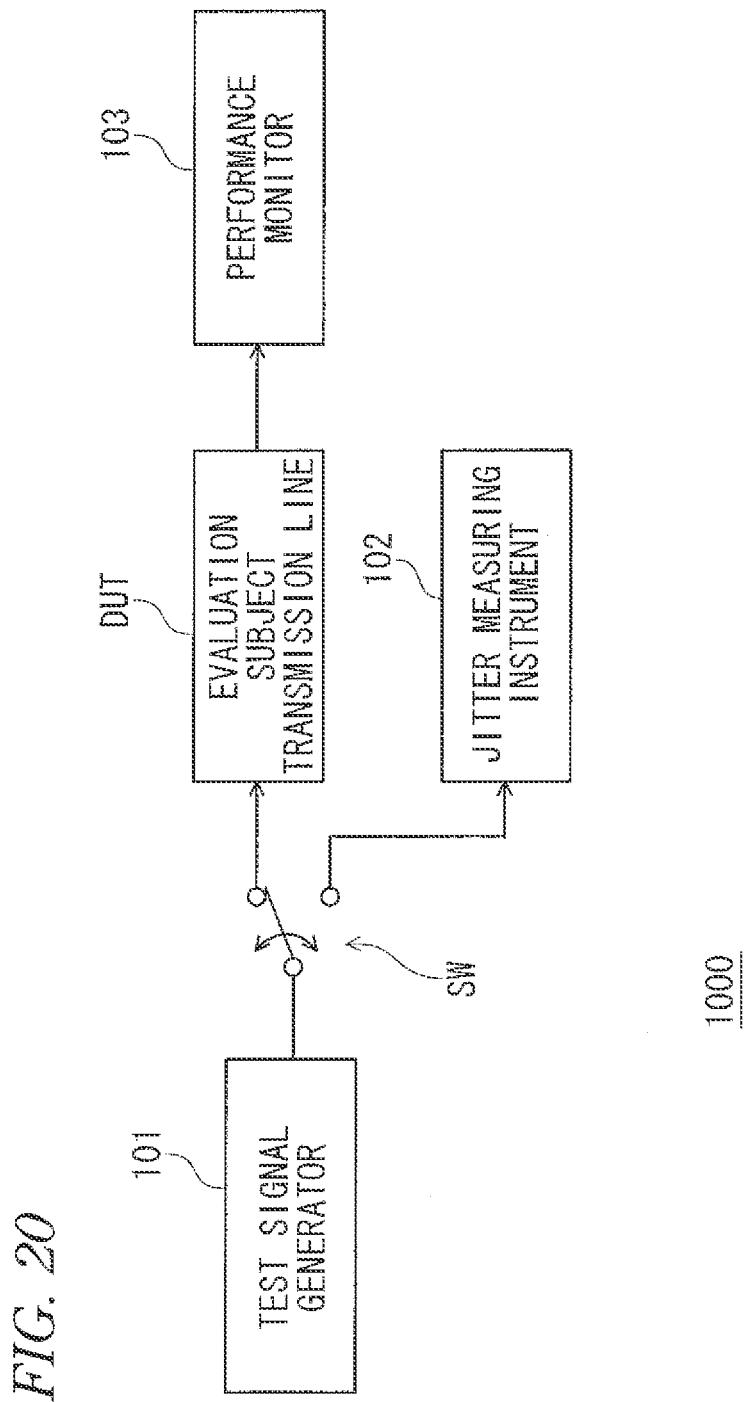
FIG. 20 is a block diagram showing an example jitter measuring system which uses a test signal generator having a jitter generating function.
Figure 21:
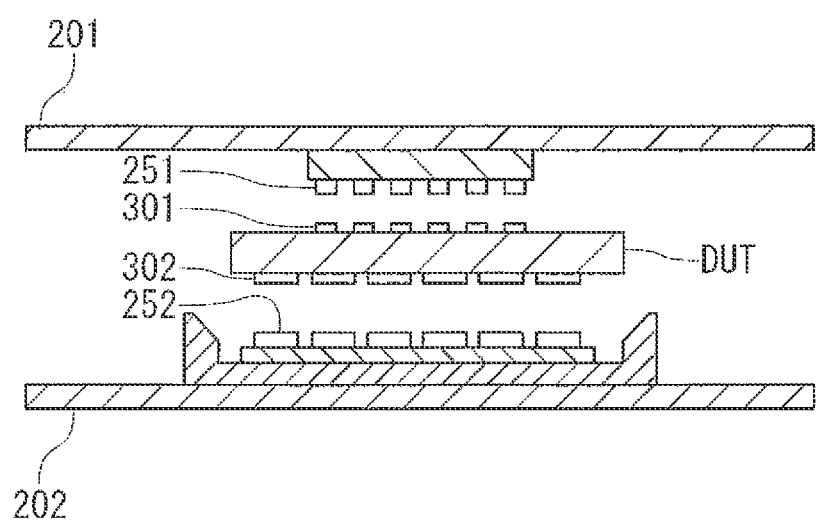
FIG. 21 is a sectional view illustrating a probe configuration for observation of an evaluation subject transmission line.
Figure 22:
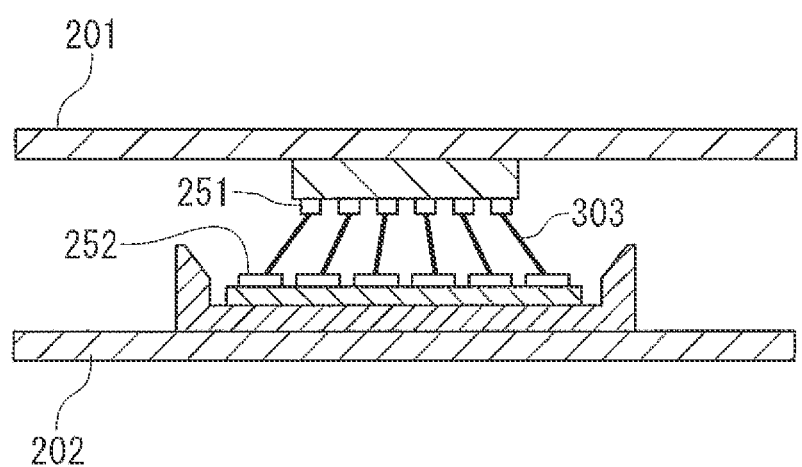
FIG. 22 is a sectional view illustrating a bypass state that probe terminals of a probe card are connected to respective socket terminals of a socket board without intervention of the evaluation subject transmission line.

FIGS. 17 and 18 are circuit diagrams illustrating signal flows in the transmission device 1 according to the embodiment of the invention. In the transmission device 1 shown in FIGS. 17 and 18, a signal compensation device 12-P which is connected to the probe-card-side adapter board 11-P of the adapter device 11 and a signal compensation device 12-S which is connected to the socket-board-side adapter board 11-S of the adapter device 11 are connected to each other in such a manner that the output DO of the equalizer module (EQ Module) E1a and the input DI of the equalizer module (EQ Module) E1b via crossing points of the data bus.

As shown in FIG. 17, a test signal that is input from each terminal of the terminal group of the probe-card-side adapter board 11-P of the adapter device 11 flows along a path indicated by thick signal lines (see FIG. 17) in the signal compensation device 12-P and is compensated for transmission losses in the equalizer module E1a. A resulting test signal is input to the equalizer module E1b via the data bus, further compensated there in advance, and output from a corresponding terminal of the terminal group of the socket-board-side adapter board 11-S of the adapter device 11. As a result, the signal path from each terminal of the terminal group of the probe-card-side adapter board 11-P to a corresponding terminal of the terminal group of the socket-board-side adapter board 11-S is made equivalent to a transmission line having no transmission losses.

As shown in FIG. 18, a test signal that is input from each terminal of the terminal group of the socket-board-side adapter board 11-S of the adapter device 11 flows along a path indicated by thick signal lines (see FIG. 18) in the signal compensation device 12-S and is compensated for transmission losses in the equalizer module E1b. A resulting test signal is input to the equalizer module E1a via the data bus, further compensated there in advance, and output from a corresponding terminal of the terminal group of the probe-card-side adapter board 11-P of the adapter device 11. As a result, the signal path from each terminal of the terminal group of the socket-board-side adapter board 11-S to a corresponding terminal of the terminal group of the probe-card-side adapter board 11-P is made equivalent to a transmission line having no transmission losses.

As is understood from the above description, jitter calibration values can easily be changed merely by changing the reference signal waveform data that is generated by the signal compensation device 12 of the transmission device 1 according to the embodiment of the invention. In the above-described gain adjusting methods, the waveform data stored in the reference signal waveform data storage memory (Ref WFD) is the same as the waveform data generated by the external reference signal source AWG. Where waveform data that has passed a reference transmission line is employed as waveform data stored in the memory (Ref WFD), the transmission device 1 is equivalent to the reference transmission line.

The transmission device according to the invention can be used as a transmission device to be used in performing correct jitter calibration taking a test path into consideration on an evaluation instrument for evaluating the transmission characteristic of a transmission line. In particular, the invention makes it possible to perform jitter calibration easily and correctly taking a test path into consideration on an evaluation instrument which has a probe structure and serves to evaluate an evaluation subject transmission line such as an IC package or an interposer in which the probe-side terminals and the socket-side terminals are different in pitch and size.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A transmission device for correcting a transmission characteristic of a DUT (device under test), the transmission device comprising:
an adapter device comprising:
a first surface having a plurality of first terminals thereon, wherein the first terminals are configured to be connected to respective probe terminals of a probe card; and
a second surface opposite to the first surface and having a plurality of second terminals thereon, wherein the second terminals are configured to be connected to respective socket terminals of a socket, and a pitch between the adjacent second terminals is different from a pitch between the adjacent first terminals,
a plurality of signal lines each electrically connecting a corresponding first terminal and a corresponding second terminal; and
an electrical signal compensation device connected to the adapter device through the signal lines and configured to compensate for a transmission loss of an electrical signal path between the corresponding first terminal and the corresponding second terminal such that the transmission loss is set to a given value,
wherein the transmission characteristic of the DUT is corrected based on the transmission loss,
the DUT includes:
terminals configured to be physically connected to the respective probe terminals of the probe card, and
other terminals configured to be physically connected to the respective socket terminals of the socket, and
the adapter is interchanged with the DUT for correcting the transmission characteristic of the DUT.

2. The device of claim 1, wherein the electrical signal compensation device is configured to compensate for the transmission loss such that the transmission loss is set to substantially zero.

3. The device of claim 1, wherein
the adapter device is provided between the probe card having the probe terminals thereon and the socket having the socket terminals thereon such that the probe terminals on the probe card face the first surface and the socket terminals on the socket face the second surface,
the pitch between the adjacent first terminals is equal to a pitch between the adjacent probe terminals, and
the pitch between the adjacent second terminals is equal to a pitch between the adjacent socket terminals.

4. The device of claim 1, wherein the adapter device comprises a first adapter board and a second adapter board bonded to the first adapter board,
wherein the first adapter board comprises:
a first base board made of an insulating member;
a first projection portion formed on the first base board;
a first flexible board provided on the first projection portion and having a plurality of first through vias therethrough, wherein each of the plurality of first terminals is formed on the first flexible board and electrically connected to a corresponding first through via;
a plurality of first strip lines each connected to the corresponding first through via; and
a first rigid board formed on the first base board so as to surround the first flexible board, and
wherein the second adapter board comprises:
a second base board made of an insulating member;
a second projection portion formed on the second base board;
a second flexible board provided on the second projection portion and having a plurality of second through vias therethrough, wherein each of the plurality of second terminal is formed on the second flexible board and electrically connected to a corresponding second through via;

a plurality of second strip lines each connected to the corresponding second through via; and a second rigid board formed on the second base board so as to surround the second flexible board, and wherein the first base board and the second base board are bonded to each other.

5. The device of claim 4, wherein the first adapter board further comprises:

a first air duct that passes through the inside of the first projection portion and the first base board and having a first opening end on a surface of the first projection portion and a second opening end on a surface of the first base board, and wherein when air is sucked from the first opening end to the second opening end, the first flexible board is fixed onto the first projection portion by air suction.

6. The device of claim 1, wherein the electrical signal compensation device comprises:

an equalizer circuit configured to compensate for a first transmission loss of a first electrical signal path from the corresponding first terminal to the electrical signal compensation device; and a pre-emphasis circuit configured to compensate for a second transmission loss of a second electrical signal path from the electrical signal compensation device to the corresponding second terminal.

7. The device of claim 6, wherein the electrical signal compensation device further comprises a switching device configured to switch a signal transmission direction between the first terminal and the second terminal.

8. A method of testing a transmission characteristic of a DUT (device under test), the method comprising:

(a) preparing the transmission device of claim 1, which is different from the DUT;

(b) detecting a transmission loss of an electric signal path between the corresponding first terminal and the corresponding second terminal of the adapter device, using the electrical signal compensation device;

(c) carrying out jitter calibration of a test signal generator in a state where the test signal generator is electrically connected to a probe card, the adapter device is provided between probe terminals of the probe card and socket terminals of a socket board;

(d) providing the DUT between the probe terminals of the probe card and the socket terminals of the socket board in place of the adapter device of the transmission device, wherein a pitch between the adjacent probe terminals is different from a pitch between the adjacent socket terminals;

(e) measuring the transmission characteristic of the OUT; and (f) correcting the transmission characteristic of the DUT based on the transmission loss detected in step (b), wherein the DUT comprises:

a plurality of first DUT terminals thereon, which corresponds to the first terminals of the adapter device; and a plurality of second OUT terminals thereon, which corresponds to the second terminals of the adapter device.

\* \* \* \* \*